(12) United States Patent
Chiu et al.

(10) Patent No.: US 8,196,748 B2
(45) Date of Patent: Jun. 12, 2012

(54) WAFER CONTAINER WITH OVAL LATCH

(75) Inventors: Ming-Chien Chiu, Tucheng (TW); Chin-Ming Lin, Tucheng (TW)

(73) Assignee: Gudeng Precision Industrial Co, Ltd, Taipei County (TW)

( * ) Notice: Subject to any disclaimer, the term of this patent is extended or adjusted under 35 U.S.C. 154(b) by 80 days.

(21) Appl. No.: 12/827,500

(22) Filed: Jun. 30, 2010

(65) Prior Publication Data

US 2011/0266192 A1    Nov. 3, 2011

(30) Foreign Application Priority Data

Apr. 29, 2010 (TW) ............................. 99113615 A

(51) Int. Cl.
*B65D 85/90* (2006.01)

(52) U.S. Cl. ........................................ 206/711; 220/315

(58) Field of Classification Search .................. 206/710, 206/711, 454; 220/315, 323–326; 292/32–37, 292/40–41; 211/41.18
See application file for complete search history.

(56) References Cited

U.S. PATENT DOCUMENTS

| | | | |
|---|---|---|---|
| 3,953,061 A | 4/1976 | Hansen et al. | |
| 4,995,430 A | 2/1991 | Bonora et al. | |
| 5,711,427 A | 1/1998 | Nyseth | |
| 5,915,562 A | 6/1999 | Nyseth et al. | |
| 5,931,512 A | 8/1999 | Fan et al. | |
| 5,957,292 A | 9/1999 | Mikkelsen et al. | |
| 6,105,782 A | 8/2000 | Fujimori et al. | |
| 6,457,598 B1 * | 10/2002 | Hsieh et al. | 206/710 |
| 6,622,883 B1 | 9/2003 | Wu et al. | |
| 6,736,268 B2 | 5/2004 | Nyseth et al. | |
| 6,880,718 B2 | 4/2005 | Eggum | |
| 6,902,063 B2 | 6/2005 | Pai et al. | |
| 7,168,587 B2 | 1/2007 | Eggum | |
| 7,182,203 B2 | 2/2007 | Burns et al. | |
| 7,549,552 B2 * | 6/2009 | Hasegawa et al. | 206/710 |
| 7,677,393 B2 * | 3/2010 | Burns et al. | 206/710 |
| 2005/0173296 A1 | 8/2005 | Hyobu et al. | |
| 2006/0283771 A1 | 12/2006 | Park | |
| 2010/0038283 A1 * | 2/2010 | Chiu et al. | 206/711 |
| 2010/0065468 A1 * | 3/2010 | Chiu et al. | 206/711 |

* cited by examiner

*Primary Examiner* — J. Gregory Pickett
*Assistant Examiner* — Andrew Perreault
(74) *Attorney, Agent, or Firm* — Ming Chow; Sinorica, LLC

(57) ABSTRACT

A wafer container includes a container body, in which a plurality of slots being disposed for supporting a plurality of wafers and an opening being formed on one sidewall of which for importing and exporting the plurality of wafers, and a door is joined with the opening of the container body for protecting the plurality of wafers therein, wherein the characteristic of the wafer container lies in that: at least one latch component is disposed in the door, the latch component including an oval cam with a pair of V-shape notches and on the surface of oval cam being a groove, a pair of moving bars including respectively an engaging portion, and a guiding element located on the moving bars, the engaging portion being engaged in the groove for the pair of moving bars to be respectively engaged with the oval cam.

6 Claims, 26 Drawing Sheets

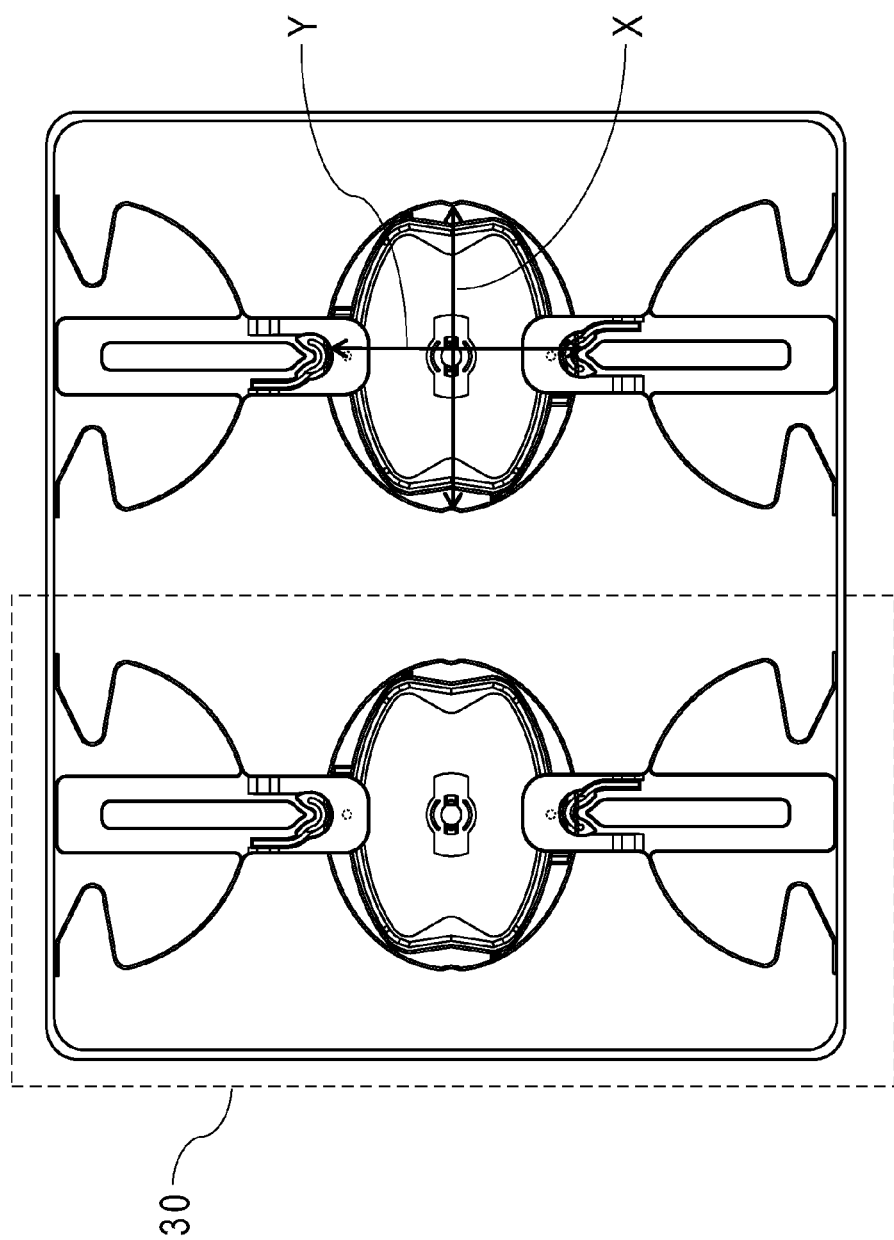

WAFER CONTAINER WITH OVAL LATCH

BACKGROUND OF THE INVENTION

1. Field of the Invention

The present invention is related to a Front Opening Unified Pod (FOUP), and more particularly, to a latch component deployed in the door of FOUP.

2. Description of the Prior Art

The semiconductor wafers need to be transferred to different work stations to go through various processes in required equipments. In order to facilitate the transferring of wafers and to prevent the pollution of wafers from occurring during transferring process, a sealed container is provided for the automatic transferring process. Referring to FIG. 1, which is a view of wafer container of the prior art. The wafer container is a Front Opening Unified Pod (FOUP) which includes a container body 10 and a door 20. The container body 10 is disposed with a plurality of slots 11 for horizontally receiving a plurality of wafers (not shown in Figure), and an opening 12 is located on a sidewall of the container body 10 for importing and exporting the wafers. The door 20 further includes an outer surface 21 and an inner surface 22, wherein the door 20 is joined with the opening 12 of the container body 10 via the inner surface 22 to protect the plurality of wafers within the container body 10. Furthermore, at least one latch hole 23 is disposed on the outer surface 21 of the door 20 for opening or closing the wafer container. According to the aforementioned, due to that the wafers are horizontally placed in the container body 10, thus, a wafer restraint component is needed in the FOUP to prevent the wafer from displacement or from movement toward the opening 12 of container body 10 to occur during the wafer transferring process due to vibration.

Referring to FIG. 2, which is a view of the door of FOUP disclosed in U.S. Pat. No. 6,736,268. As shown in FIG. 2, the inner surface 22 of door 20 is disposed with a recess 24, which extends from the top end 221 of the inner surface 22 to the bottom end 222 and is located between the two latch components 230 (within the door). The wafer restraint module consisting of two wafer restraints 100 set aside each other is further disposed in the recess 24. Each wafer restraint 100 further includes a plurality of wafer contacts 110 for sustaining corresponding wafers to prevent the wafers from being displaced or moving toward the opening of the container body due to vibration during the transferring process. However, the aforementioned wafer restraint module is disposed in the recess 24 of the inner surface 22 of the door 20, and thus the wafers are merely attached to the inner surface 22 of the door 20 or partially settled down within the recess 24. As a result, the wafers cannot be securely and fully settled into the recess 24 in order to effectively shorten the length between the front side and the back side of the FOUP. In addition, dust particles generated due to the friction between the wafer restraint module and the wafers can be easily accumulated in the recess 24. In the process of cleaning the accumulated dust particles, it is necessary to separate the wafer restraint module from the recess 24 on the inner surface 22 of the door 20. Frequent separation and re-assembly of the wafer restraint module thus causes the wafer restraint module to slacken easily.

Furthermore, FIG. 3 is a view of latch component 230 in the door 20 of a Front Opening Unified Pod (FOUP) as described in U.S. Pat. No. 5,711,427. The method for assembling door 20 and container body 10 is mainly to dispose movable bolts 231 on the two sides of door 20, i.e. between outer surface 21 and inner surface 22, and to dispose socket holes 13 (referring to FIG. 1) near the edge of opening of door 10 for corresponding to the bolts 231. The objective of fixing door 20 in the container body 10 can thus be achieved with the rotation of latch hole 23 (referring to FIG. 1) disposed on the outer surface 21 of door 20 that leads to the insertion of latch bolts 231 into socket holes 13, wherein the insertion and withdrawal of bolts 231 is controlled by the rotation of latch hole 23 via a round-shaped cam 232.

And in the actual operation of semiconductor factory, the opening of FOUP is mainly operated through a Wafer Load Port, which comprises at least a latch key. The latch key of this Wafer Load Port is inserted into the latch hole 23 on the outer surface 21 of the door of FOUP for rotating the round-shaped cam 232 and thus driving the movable latch bolts 231 to open or close the FOUP. In addition, according to the SEMI standards, the size of latch key and the size of latch hole are standardized. However, in a FOUP designed according to the required standards, an arrestment error of 9.44 degrees will occur when the corresponding latch key and latch hole are rotated. Therefore, when the FOUP is horizontally placed, if the error is more than 9.44 degrees, the latch key is not able to rotate the latch hole to operate the cam and thus the door cannot be successfully opened.

In addition, other U.S. patents that describe latch component in door of FOUP include U.S. Pat. Nos. 5,915,562, 5,957,292, 6,622,883, and 6,902,063. In order to achieve air tightness when joining the door and the container body, the movable bolts of latch component will shift longitudinally for fastening a springy air-tight component, which leads to achievement of both objectives of closing FOUP and achieving air tightness. However, in prior latch patents, complex mechanic apparatuses are used, which not only result in higher failure rate but also generate too much mechanical friction in the operating process that pollutes wafers. Moreover, the air tightness achieved by fastening springy air-tight component with shift of movable bolts cannot sustain for very long time and is not effective enough.

Moreover, in conventional FOUP, some restraint components are disposed on the inner surface of door 20. Thus when the door 20 closes container body 10, the restraint components contact wafers and completely fix the wafers in order to prevent displacement of wafers in FOUP from happening during transferring procedure. And in order to avoid too forceful collision or friction between restraint components and wafers when contacting, therefore, as shown in FIG. 4, a few U.S. patents disclose springy component 86 that is disposed between cam 232 in latch component 230 and door 20. In the process in which cam 232 rotates and drives movable bolts 231 to close FOUP, this springy component 86 can function as damping for restraint component disposed on inner surface of door 20 to contact wafers under mitigated and smooth condition, and thus the problem of collision and friction can be solved. U.S. patents related to such design include U.S. Pat. Nos. 6,880,718, 7,168,587, and 7,182,203. However, when this way of laterally driving is employed, it is easy for an offsetting force to generate on the moving direction of movable bolts 231, which causes failure of insertion of movable bolts into socket holes 13 of container body 10. Thus, container body 10 and door 20 cannot be closed, and more problems in the production occur.

SUMMARY OF THE INVENTION

In the door component of front opening unified pod (FOUP) of prior art, the latch component is composed of complex mechanic apparatus, which not only leads to higher failure rate but also generates too much mechanic friction in the operating process that may lead to pollution of wafer. One primary objective of the present invention is thus to provide a front opening unified pod (FOUP) disposed with latch component with oval cam so that the moving bars can move to and fro on only one plane surface and the structure of the latch component can also be simplified.

Another primary objective of the present invention is to provide a front opening unified pod (FOUP) disposed with latch component with oval cam, wherein with the correspondence of engaging portions and grooves, the moving bars can be driven by the oval cam to move to and fro on only one plane surface, the design of which reduces friction generated in the moving process of moving bars and also reduces pollution.

Still another primary objective of the present invention is to provide a front opening unified pod (FOUP) disposed with latch component with oval cam, wherein with the mutual interference of the guiding elements and the V-shaped notches, even if there is an error in the angle of latch key, the latch key can still be correctly inserted into the latch hole and drive the oval cam and thus to compensate and eliminate the arrestment error generated between the latch key and the latch hole for the door to be successfully opened.

Yet another primary objective of the present invention is to provide a front opening unified pod (FOUP) disposed with latch component with oval cam, wherein with the mutual interference of the guiding element and the long narrow spring, even if there is an error in the angle of latch key, the latch key can still be correctly inserted into the latch hole and drive the oval cam and thus to compensate and eliminate the arrestment error generated between the latch key and the latch hole for the door to be successfully opened.

And still another primary objective of the present invention is to provide a front opening unified pod (FOUP) disposed with latch component with oval cam, wherein with the correspondence of fixing structure and fixing notches, the function of automatic fixing is provided when the oval cam rotates either horizontal or perpendicular.

And yet another primary objective of the present invention is to provide a front opening unified pod (FOUP) disposed with latch component with oval cam, wherein with the correspondence of spring element and fixing notches, the function of automatic fixing is provided when the oval cam rotates either horizontal or perpendicular.

And still another primary objective of the present invention is to provide a front opening unified pod (FOUP) disposed with latch component with oval cam, wherein the inner surface of the door is disposed with wafer restraint components for effectively fixing the wafers.

And yet another primary objective of the present invention is to provide a front opening unified pod (FOUP) disposed with latch component with oval cam, wherein the arrester of the center of oval cam is made of polymer plastic material, and more particularly of highly wear-resistant material such as PEEK, to reduce particles generated during the to-and-fro operation and thus reduce the pollution in the FOUP.

According to above objectives, the present invention provides a front opening unified pod (FOUP), which includes a container body and a door. A plurality of slots are disposed in the container body for sustaining a plurality of wafers, and an opening is formed on one sidewall of the container body for importing and exporting the plurality of wafers. The door includes an outer surface and an inner surface; the door is joined with the opening of container body via its inner surface for protecting the plurality of wafers in the container body. The characteristic of front opening unified pod (FOUP) is in that: a recess is disposed in the inner surface of the door and the recess is located between two platforms, each of which is disposed with a latch component that includes an oval cam and an arrester disposed in the center of the oval cam. At least a pair of V-shaped notches are disposed on a surface of the oval cam, and on the surface of the oval cam are disposed with at least a groove, a pair of moving bars respectively disposed with an engaging portion which is engaged in the groove for the pair of moving bars to be engaged with the oval cam, and a guiding element disposed on the moving bars. Wherein the arrester is used to control the rotation of the oval cam for the moving bars to go to and fro between the pair of socket holes and the pair of latch holes.

The present invention then provides a front opening unified pod (FOUP), which includes a container body and a door. A plurality of slots are disposed in the container body for sustaining a plurality of wafers, and an opening is formed on one sidewall of the container body for importing and exporting the plurality of wafers. The door includes an outer surface and an inner surface; the door is joined with the opening of container body via its inner surface for protecting the plurality of wafers in the container body. The characteristic of front opening unified pod (FOUP) is in that: a recess is disposed in the inner surface of the door and the recess is located between two platforms, each of which is disposed with a latch component that includes an oval cam and an arrester disposed in the center of the oval cam. A plurality of V-shaped notches are disposed on the two opposite ends of the longer and the shorter diameters of the oval cam, and on a surface of the oval cam are disposed with at least a groove, a pair of moving bars respectively disposed with an engaging portion which is engaged in the groove for the pair of moving bars to be engaged with the oval cam, and a guiding element disposed close to the end where the moving bars and the oval cam are engaged with each other. The guiding element is composed of a guiding wheel and at least a pair of guiding rods disposed on the guiding wheel. Wherein the arrester is used to control the rotation of the oval cam for the moving bars to go to and fro between the pair of socket holes and the pair of latch holes.

The present invention further provides a front opening unified pod (FOUP), which includes a container body and a door. A plurality of slots are disposed in the container body for sustaining a plurality of wafers, and an opening is formed on one sidewall of the container body for importing and exporting the plurality of wafers. The door includes an outer surface and an inner surface; the door is joined with the opening of container body via its inner surface for protecting the plurality of wafers in the container body. The characteristic of front opening unified pod (FOUP) is in that: a recess is disposed in the inner surface of the door and the recess is located between two platforms, each of which is disposed with a latch component that includes an oval cam and an arrester disposed in the center of the oval cam of the latch component. A surface of the oval cam is disposed with at least a groove, a pair of moving bars respectively disposed with an engaging portion which is engaged in the groove for the pair of moving bars to be engaged with the oval cam, a guiding element disposed at the center of the oval cam, and a long narrow spring framingly disposed on the guiding element. Wherein the arrester is used to control the rotation of the oval cam for the moving bars to go to and fro between the pair of socket holes and the pair of latch holes.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 5A is a view of the door of a front opening unified pod (FOUP) of the present invention;

DESCRIPTION OF THE PREFERRED EMBODIMENT

The present invention discloses a front opening unified pod (FOUP), which includes a container body and a door. A plurality of slots are disposed in the container body for sustaining a plurality of wafers, and an opening is formed on one sidewall of the container body for importing and exporting the plurality of wafers. The door includes an outer surface and an inner surface; the door is joined with the opening of container body via its inner surface for protecting the plurality of wafers in the container body. Moreover, the outer surface of the door is disposed with at least a latch hole for opening or closing the FOUP. The structure of FOUP utilized in the present invention is the same as that of FOUP as described above, and therefore the details of manufacturing or processing processes are not completely described in the following. The drawings referred to in the following description are not made according to actual sizes and their function is only to illustrate characteristics of the present invention. In addition, the technical contents and objectives of and the effects achieved by the present invention are all completely and detailedly disclosed in the following description accompanied by drawings and signs.

Figure 5B:
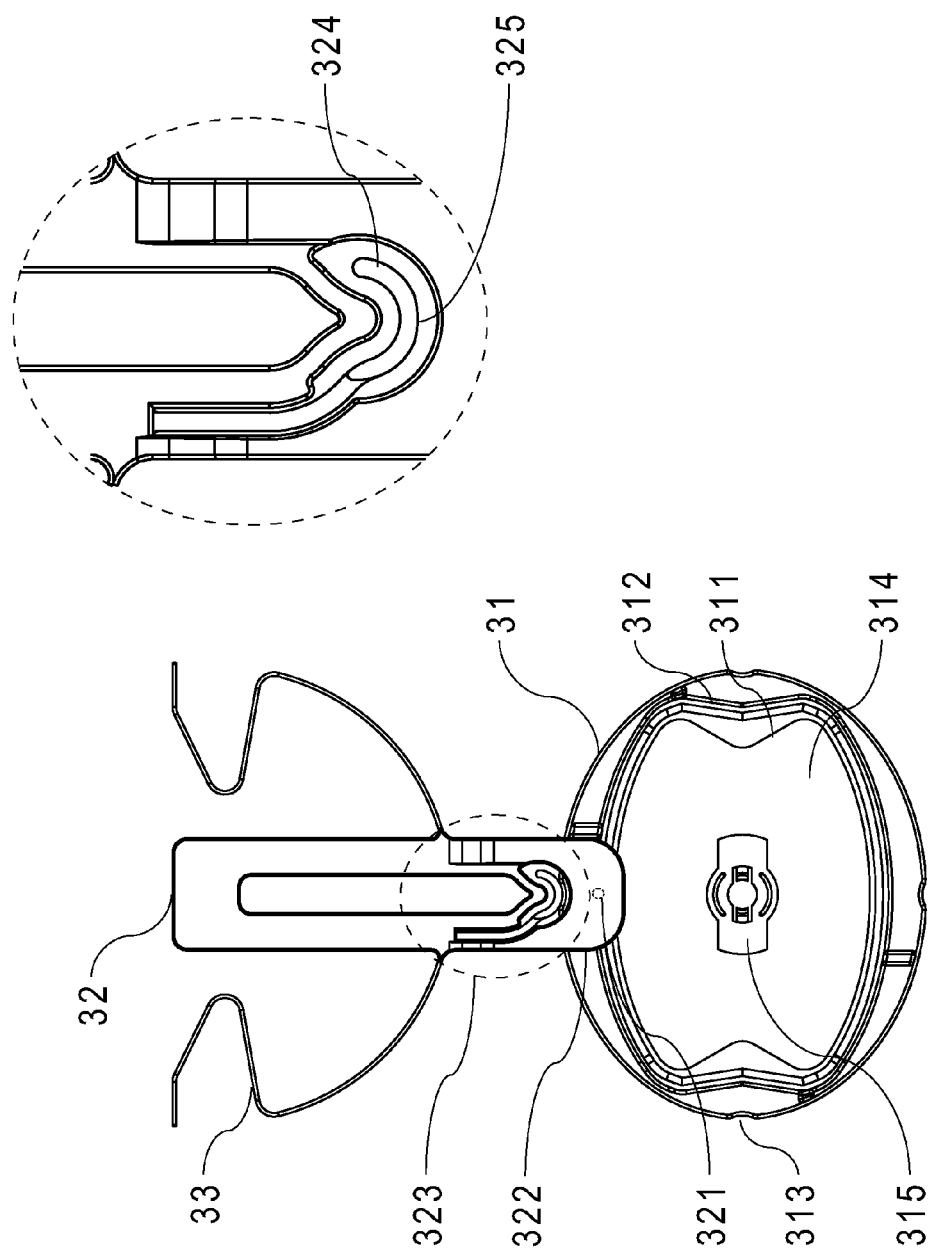
FIG. 5B is a view of the latch component of the present invention.
Figure 5C:
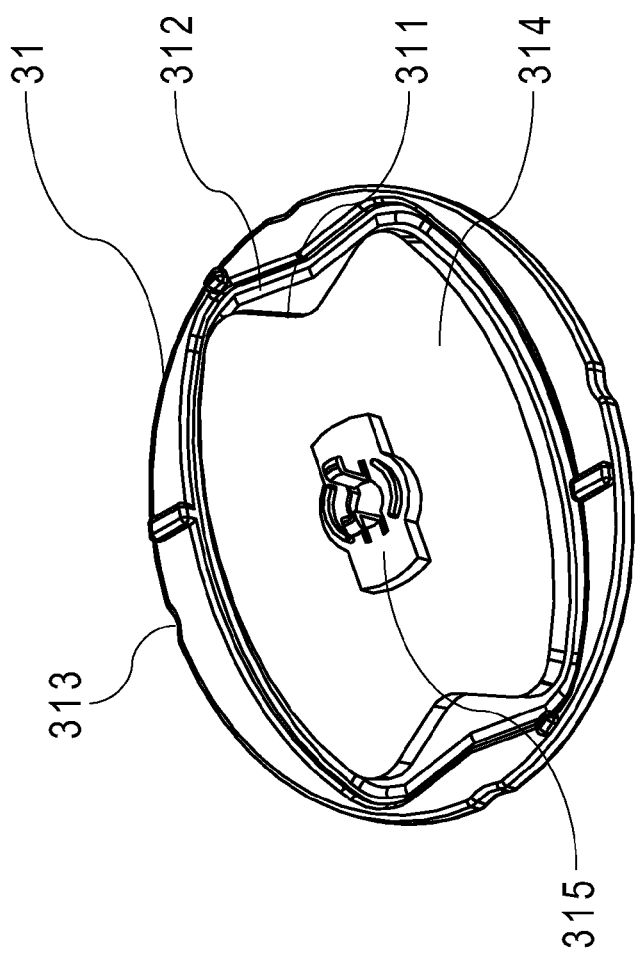
FIG. 5C is a stereogram of the oval cam of the present invention.

First of all, the basic structure of FOUP (referring to FIG. 2) comprises a door 20 with its inner surface 22 disposed with a recess 24 that is located between two platforms 25, each platform 25 being disposed with a latch component 230. Then referring to FIG. 5A, which is a top view of the first embodiment of latch component of the present invention. As shown in FIG. 5B, each latch component 30 is composed of an oval cam 31 with a pair of V-shaped notches 311, a pair of moving bars 32 respectively disposed with an engaging portion 321, a guiding element 322 disposed on the pair of moving bars 32, and a fixing spring 33 that is integrated with the moving bars 32, wherein the guiding element 322 is on one end of the moving bars 32 and is roughly U-shaped. Moreover, the surface of the oval cam 31 is disposed with at least a groove 312, in which the pair of engaging portions 321 of the moving bars 32 are respectively engaged for the pair of moving bars 32 to be engaged with the oval cam 31. Referring then to FIG. 5C, at least a pair of fixing notches 313 are oppositely disposed on the two ends of the long-axis diameter and the short-axis diameter of the oval cam 31, and an oval platform 314 is protrusively disposed on the surface of the oval cam 31 disposed with groove 312, the square measure of the oval platform 314 being smaller than that of the oval cam 31 and the V-shaped notches 311 on the oval cam 31 being disposed on the two ends of the longer diameter of the oval platform 314.

In the first embodiment of the present invention, the oval cam 31 can be made of metal (such as stainless steel) or polymer plastic material (such as Teflon and PEEK), which is not limited in the present invention. As shown in FIG. 5B, an arrester 315 is further disposed at the center of the oval cam 31. When the opening latch (not shown in Figure) of the Wafer Load Port is inserted into the latch hole 23 of the door 20, it connects the arrester 315 to drive the oval cam 31 to rotate. Since the arrester 315 and the opening latch are in contact with each other in the process in which the oval cam 31 is driven to rotate, the arrester 315 of the present invention can be made of polymer plastic material, especially highly wear-resistant material such as PEEK, to reduce particles generated during the to-and-fro operation and pollution in the FOUP.

Figure 1:
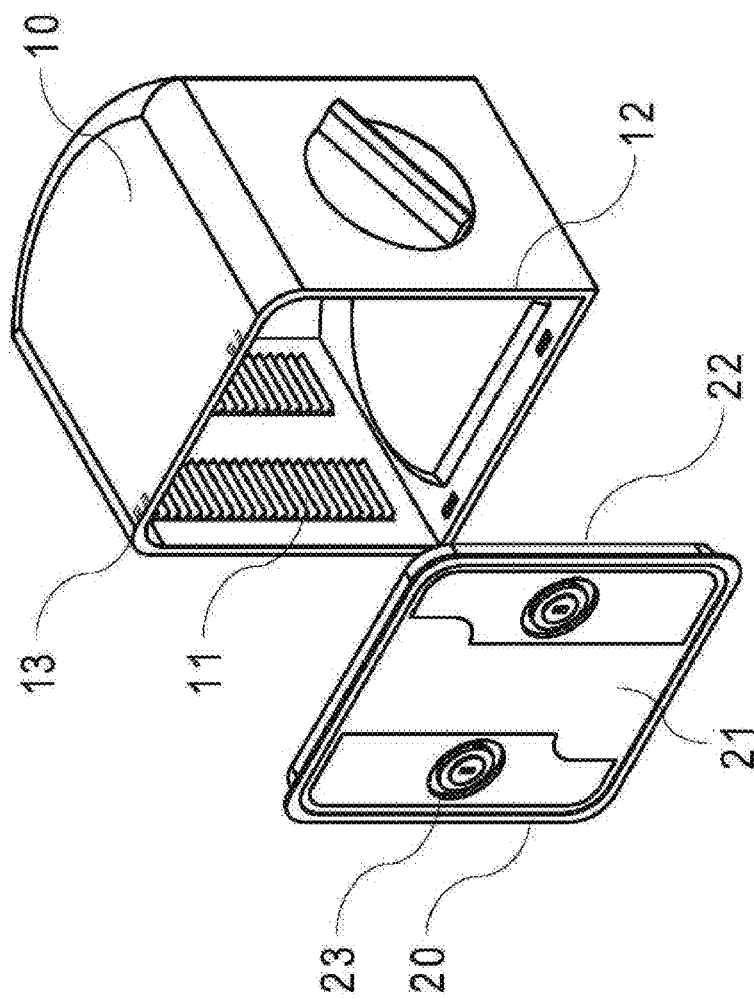
FIG. 1 is a view of the front opening unified pod (FOUP) of the prior art.
Figure 2:
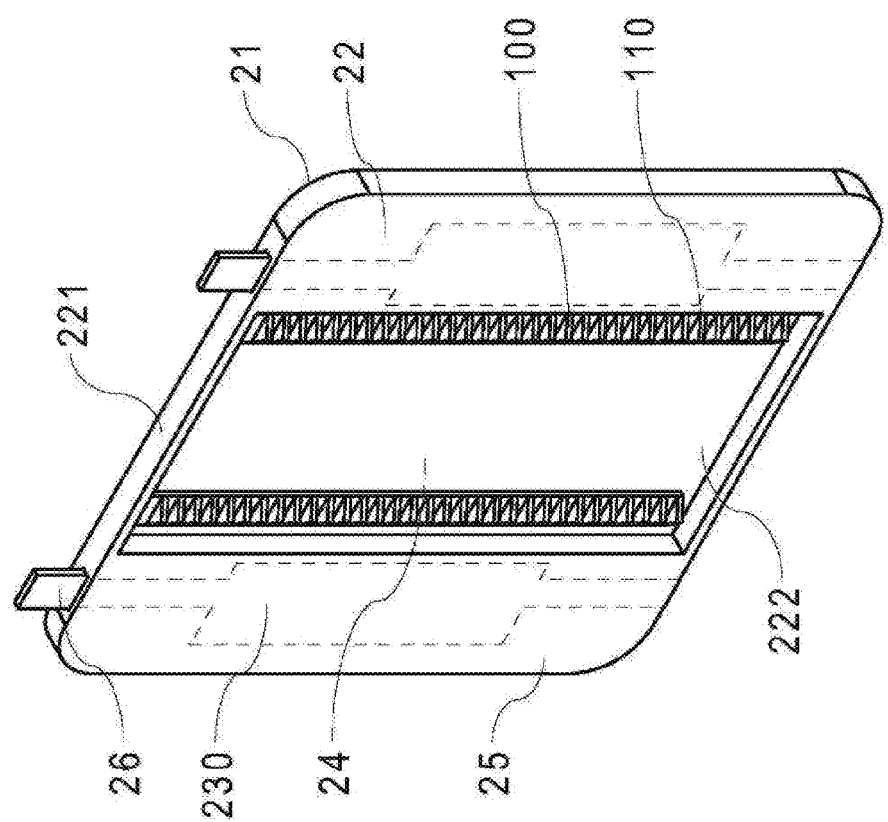
FIG. 2 is a view of the door of the front opening unified pod (FOUP) of the prior art.
Figure 3:
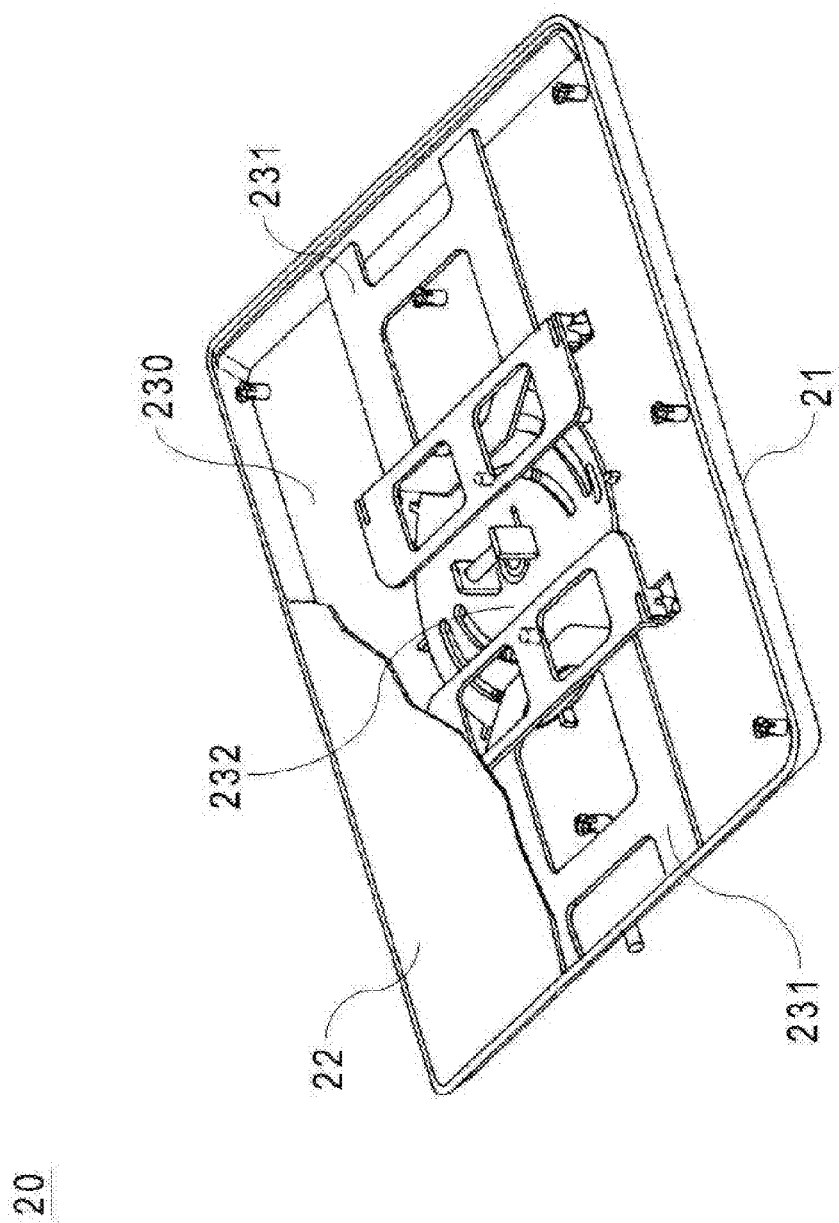
FIG. 3 is a view of another door of front opening unified pod (FOUP) of the prior art.
Figure 4:
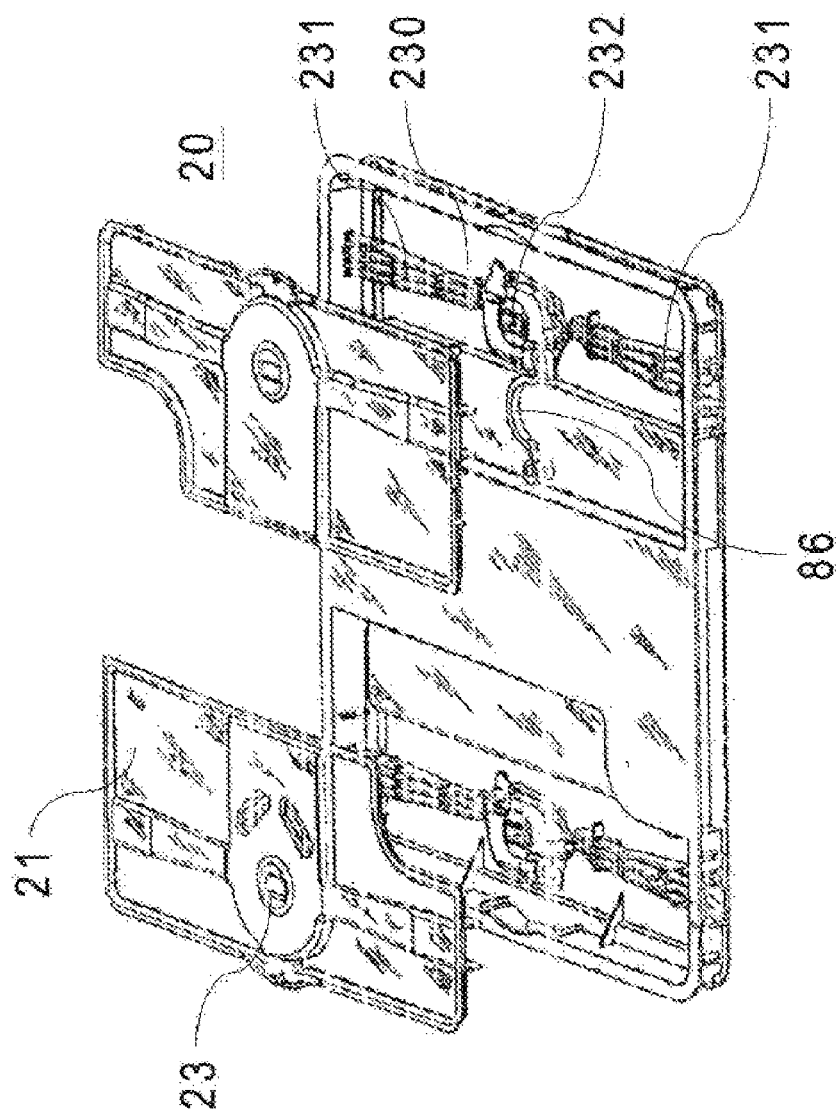
FIG. 4 is a view of still another door of front opening unified pod (FOUP) of the prior art.

Then, referring to FIGS. 6A to 6E, which are views of the rotation process of oval cam of the first embodiment of the present invention. In the present embodiment, by controlling the rotation of the oval cam 31, the moving bars 32 go to and fro between a pair of socket holes 13 (as shown in FIG. 1) and a pair of latch holes 26 (as shown in FIG. 2). The way of operation is as sequentially shown in FIGS. 6A to 6E, in which the rotation process of oval cam is viewed as being rotated clockwise for 90 degrees. The long-axis distance of the oval cam is used for pushing the moving bars 32 out of the latch holes 26 for the moving bars 32 to be inserted into the socket holes 13. And vice versa, if the rotation process of oval cam is sequentially shown in FIGS. 6E to 6A, then the process is viewed as being rotated counter-clockwise for 90 degrees, wherein the moving bars 32 are pulled out of the socket holes 13 and withdrawn into the latch holes 26. The mechanical principle is that, with the oval cam 31 having a longer diameter X and a shorter diameter Y (as shown in FIG. 5A), the moving bars 32 will operate according to the changing radius of the oval cam 31 when the oval cam 31 rotates. Moreover, what is to be emphasized is that, the aforementioned way of rotation of the oval cam 31 can also lead the guiding elements 322 of moving bars 32 and the V-shaped notches 311 of oval cam 31 to interfere with each other so that the oval cam 31 automatically rotates to a fixed position when rotating to a certain angle for the moving bars 32 to be pushed out of or withdrawn into the latch holes 26.

Figure 6A:
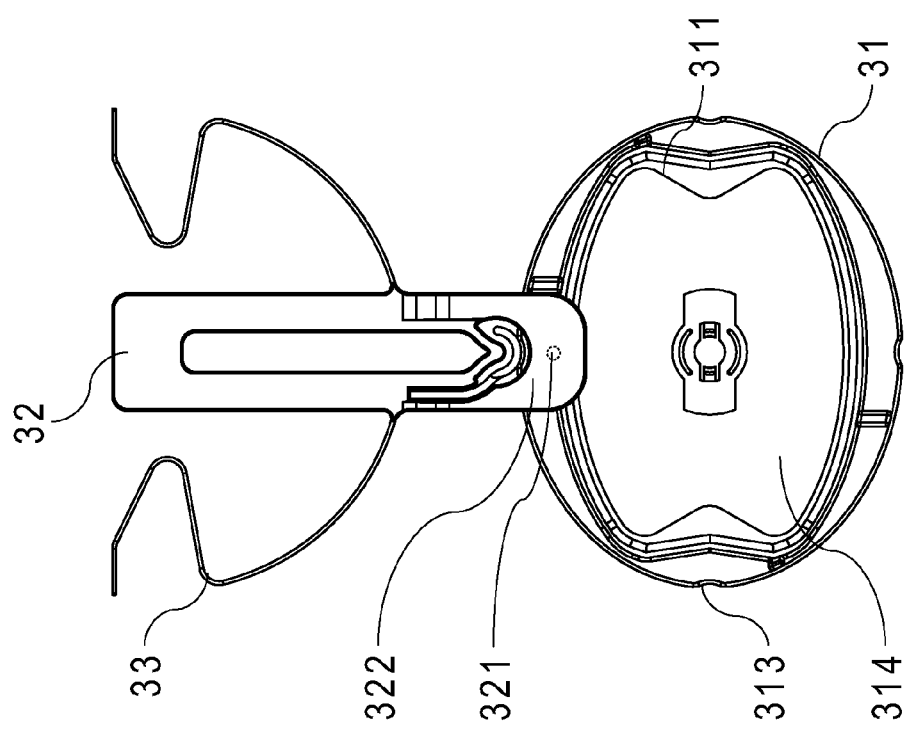
FIG. 6A to FIG. 6E are views of the operation of latch component of the present invention.
Figure 6B:
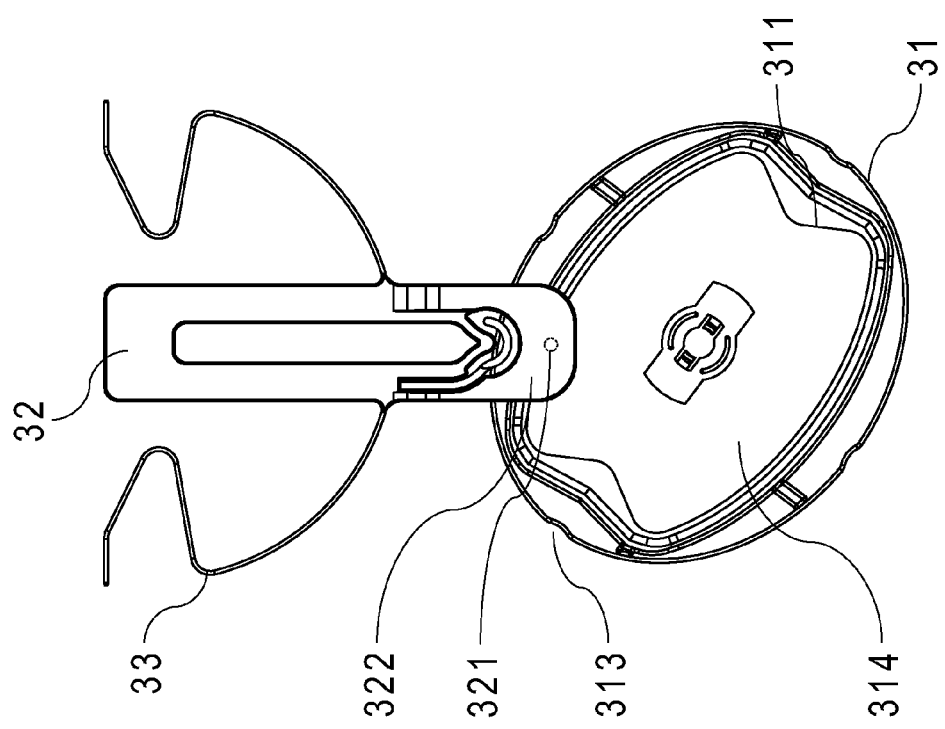
Figure 6C:
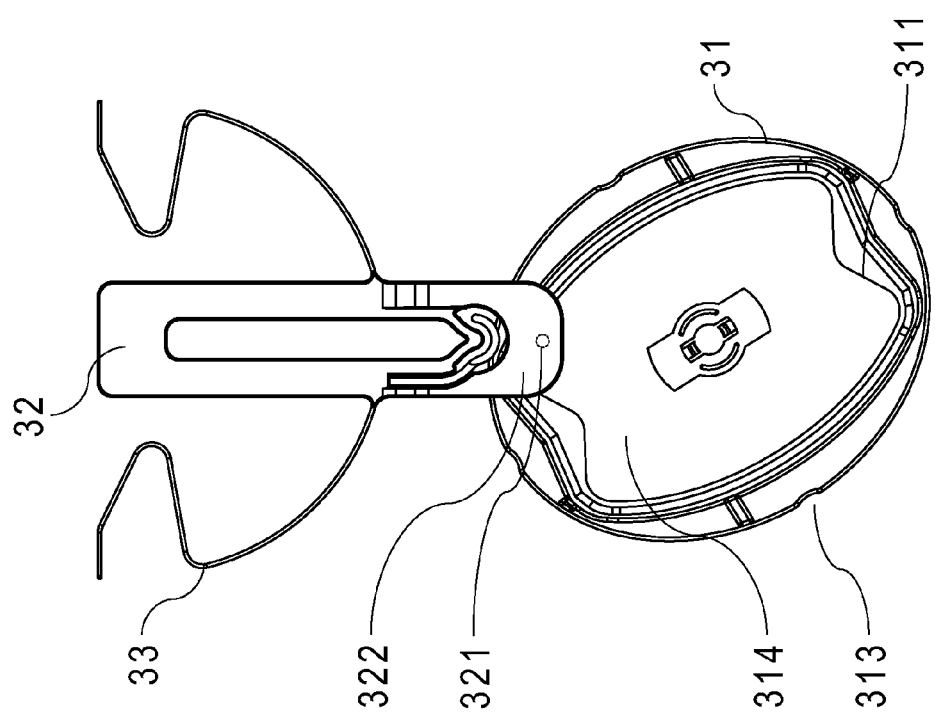
Figure 6D:
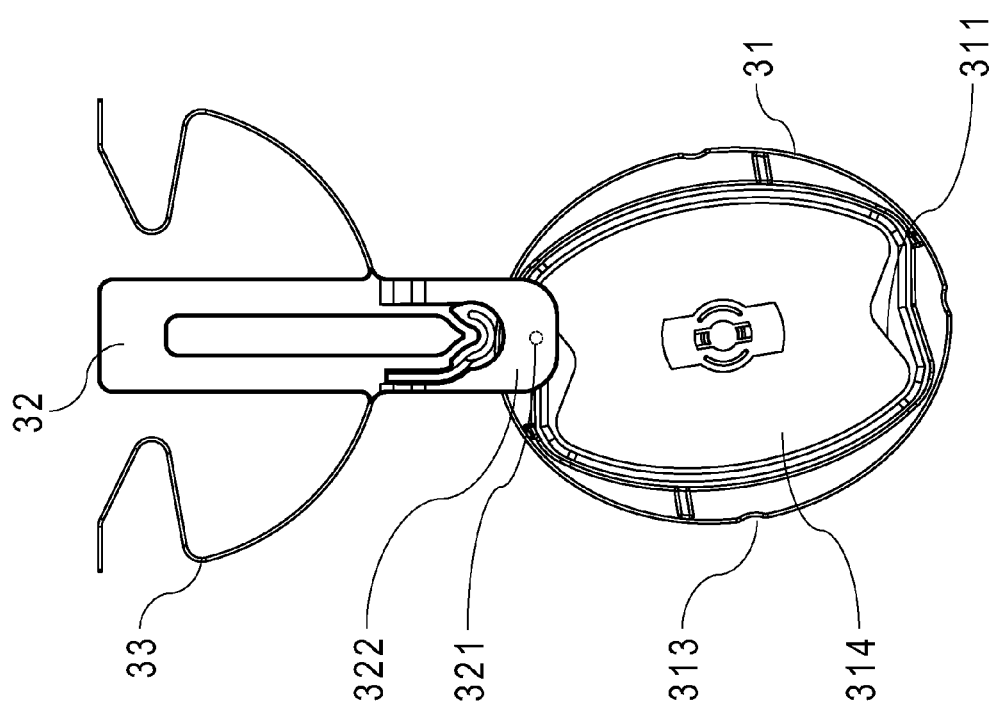
Figure 6E:
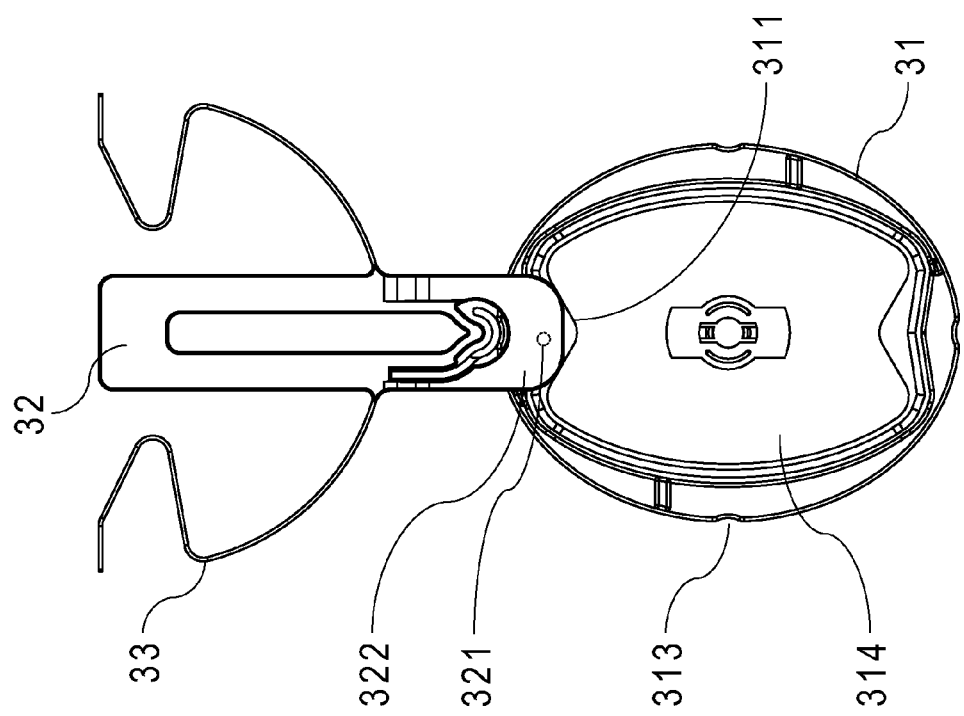

The way how the guiding elements 322 and the V-shaped notches 311 of the present embodiment interfere with each other is further described: when the rotation position of oval cam 31 is as shown in FIG. 6A, i.e. a pair of the fixing portion 325 of the fixing structure 323 of the moving bars 32 are in contact with the fixing notch 313 of the two ends of the shorter diameter Y of the oval cam 31, the guiding elements 322 and the oval platform 314 merely contact with and resist each other; when the rotation position of oval cam 31 is as shown in FIG. 6B, the moving bars 32 extend toward the exterior since the radius of the oval cam 31 becomes longer, and the fixing spring 33 is also pulled by the moving bars 32 and receives a pressure since the moving bars 32 and the fixing spring 33 are integrated with each other; when the rotation position of oval cam 31 is as shown in FIG. 6C (the difference between the rotation position shown in FIG. 6A and that in FIG. 6C is 68 degrees), the guiding elements 322 are in contact with and resist a vertex of V-shaped notches 311 of the oval cam 31, and at the same time, the pressure received by the fixing spring 33 is larger than that received as in FIG. 6B; when the rotation position of oval cam 31 is as shown in FIG. 6D, i.e. the oval cam 31 rotates more than 68 degrees, the point where the guiding elements 322 and the V-shaped notches 311 contact and resist each other is beyond the vertex, and thus the pressure received by the fixing spring 33 is smaller than that received as in FIG. 6C; as the pressure received by the fixing spring 33 is released, the oval cam 31 rotates automatically to FIG. 6E, and the guiding elements 322 slide in-between the two vertexes of the V-shaped notches 311 and halt. Following the operation described above, the moving bars 32 are now pushed out of the latch holes 26 and inserted into the socket holes 13 of the container body 10 for the door 20 to lock and close the container body 10. In the present embodiment, when the FOUP of the present invention is horizontally placed, even if the error in angle of the opening latch (not shown in Figure) of the Wafer Load Port is larger than 9.44 degrees, the oval cam 31 can still be operated to compensate and eliminate the arrestment error between the opening latch and the latch holes 23 for the door to be successfully locked or opened. Similarly, for the door 20 to be detached from the container body 10, the rotation position of oval cam 31 changes from that shown in FIG. 6E to that shown in FIG. 6C with the oval cam 31 rotating 22 degrees counter-clockwise; when the rotation degree is larger than 22 degrees, the guiding elements 322 move away from the V-shaped notches 311 and the operation of opening is completed.

The operation of oval cam 31 is described in detail as above. Referring then to FIG. 5B, a fixing structure 323 is further disposed near the end where the moving bars 32 and the oval cam 31 are engaged with each other in the present invention. The fixing structure 323 is a hollowed-out spring element 324 and has a fixing portion 325 protruding from the spring element 324; the fixing structure 323 is integrated with the moving bars 32 and is manufactured by injection molding. When the oval cam 31 automatically rotates to a fixed position, i.e. the oval cam 31 rotates to a horizontal fixed position as shown in FIG. 6A or to a perpendicular fixed position as shown in FIG. 6E, the fixing portion 325 on fixing structure 323 and the fixing notch 313 snap with and fix each other to provide the function of automatic aligning-fixing and halting.

Figure 7A:
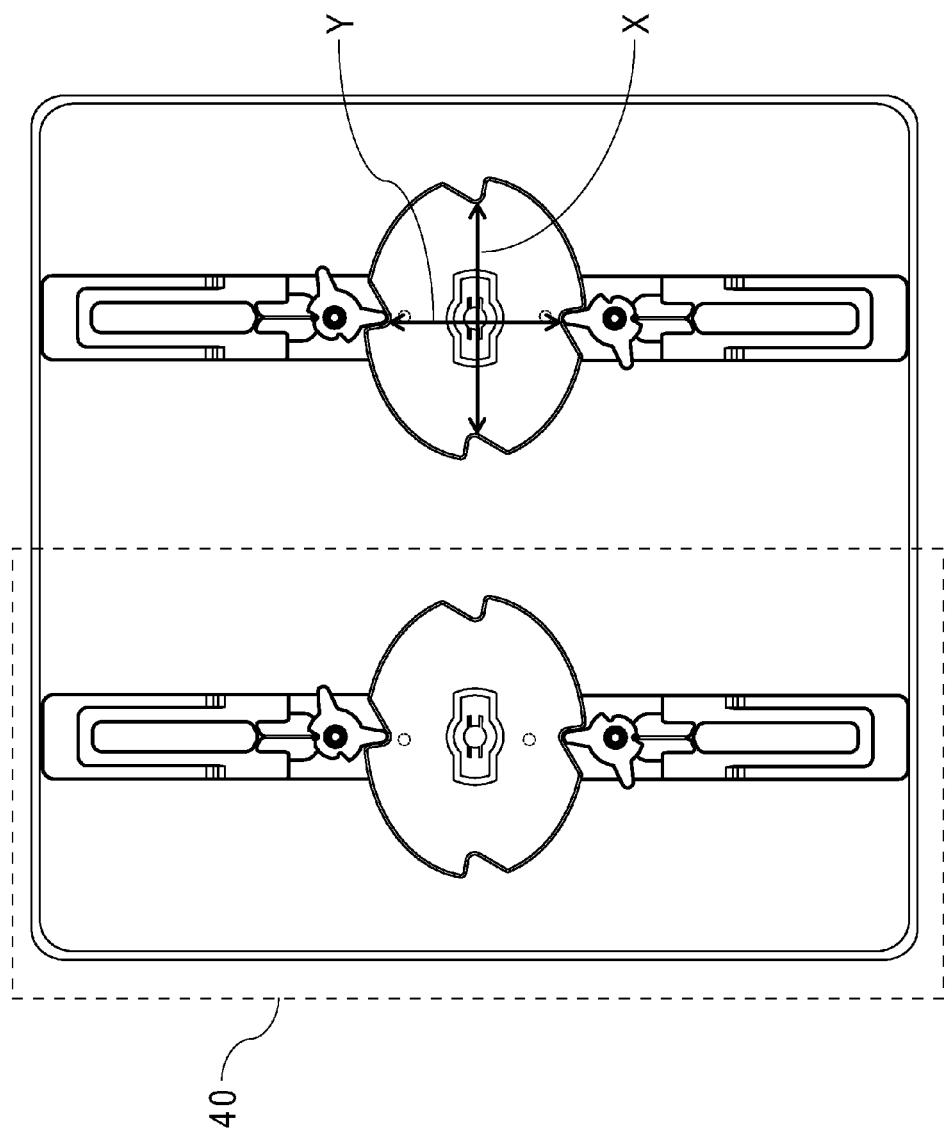
FIG. 7A is a view of the door of a front opening unified pod (FOUP) of the present invention.
Figure 7B:
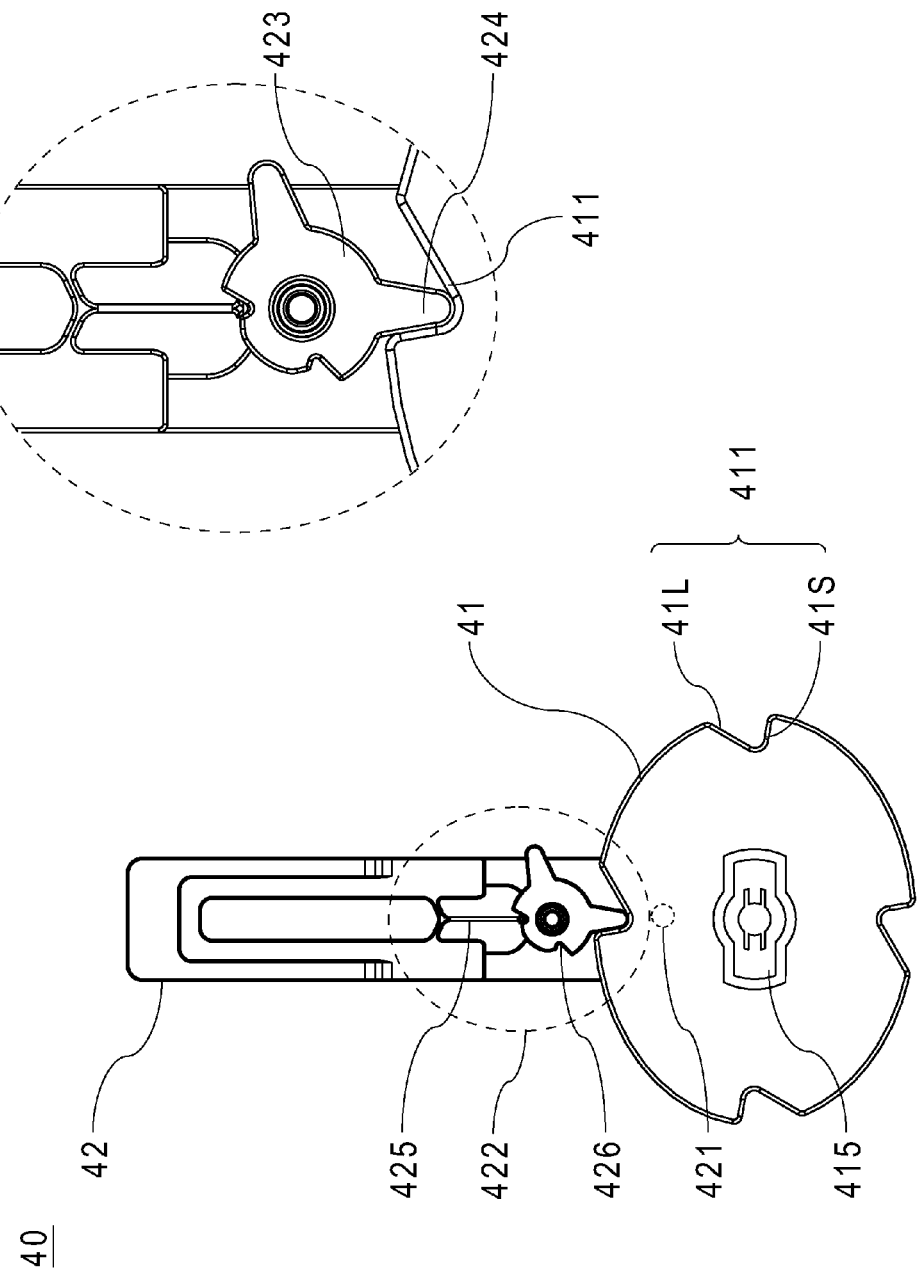
FIG. 7B is a front view of the latch component of the present invention.
Figure 7C:
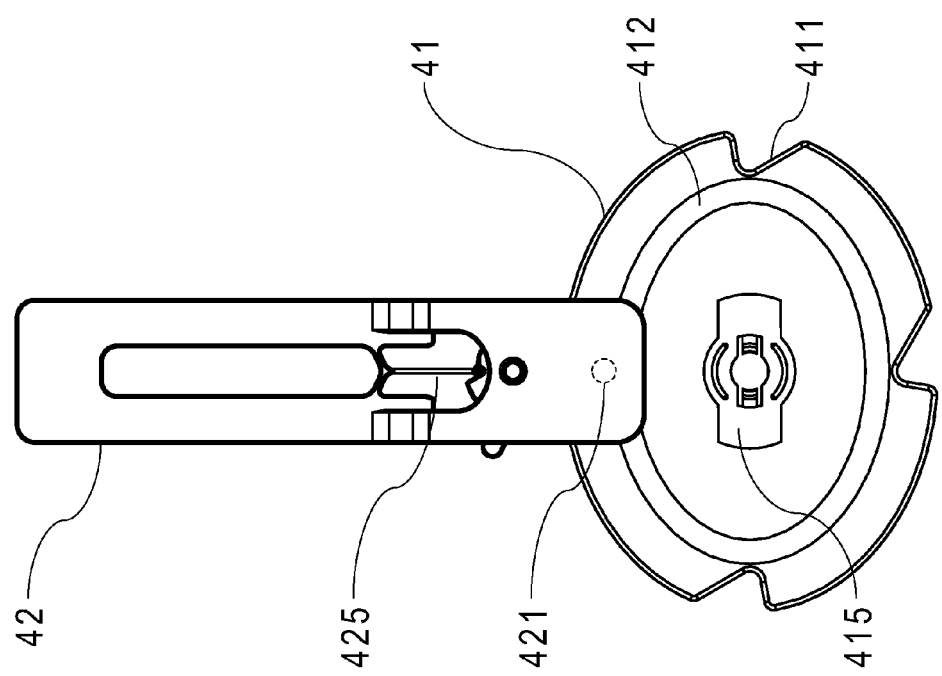
FIG. 7C is a rear view of the latch component of the present invention.

Referring to FIG. 7A, which is a top view of the second embodiment of latch component of the present invention. FIG. 7B is a front view of the latch component, and FIG. 7C is a rear view of the latch component. As shown in FIG. 7B, each latch component 40 is composed of an oval cam 41 with four circumferential vertexes respectively having a pair of V-shaped notches 411, a pair of moving bars 42 respectively having an engaging portion 421 (as shown in FIG. 7C), and a guiding element 422 disposed on the moving bars 42. Then referring to FIG. 7C, at least a groove 412 is disposed on the surface of oval cam 41 for the engaging portions 421 of the pair of moving bars 42 to be respectively engaged in the groove 412, and thus the pair of moving bars 42 can be engaged with the oval cam 41. Furthermore, the structure of V-shaped notches 411 on the two opposite ends of the long and the short diameters of the oval cam 41 is shown in FIG. 7B, the V-shape notches 411 being formed by a longer side 41L and a shorter side 41S. In addition, the guiding element 422 is disposed near the end where the moving bars 42 and the oval cam 41 engage with each other. The guiding element 422 is composed of a guiding wheel 423 and a pair of guiding rods 424 that are disposed on the guiding wheel 423, the pair of guiding rods 424 protruding from the edge of the guiding wheel 423 and being neighboring to each other. In addition, a pair of fixing notches 426 can be further disposed on the guiding wheel 423 between the two guiding rods 424.

In the present embodiment, the oval cam 41 can be made of metal (such as stainless steel) or polymer plastic material (such as Teflon and PEEK), which is not limited in the present invention. As shown in FIG. 7B, an arrester 415 is further disposed at the center of the oval cam 41. When the opening latch of the Wafer Load Port is inserted into the latch hole 23 of the door 20, it connects the arrester 415. Since the opening latch and the arrester 415 are in contact with each other in the process in which the oval cam 41 is driven to rotate, therefore, to reduce friction between the opening latch and the arrester 415, the arrester 415 of the present invention can be made of polymer plastic material, especially highly wear-resistant material such as PEEK, to reduce particles generated during the to-and-fro operation and pollution in the FOUP.

Then, referring to FIGS. 8A to 8E, which are views of the rotation process of oval cam of the second embodiment of the present invention. In the present embodiment, by controlling the rotation of the oval cam 41, the moving bars 42 go to and fro between a pair of socket holes 13 (as shown in FIG. 1) and a pair of latch holes 26 (as shown in FIG. 2). First, when the socket holes 13 on the moving bars 42 and the latch holes 26 are to be joined with each other, i.e. when the door 20 of the FOUP is to be closed, the way of operation is as sequentially shown in FIGS. 8A to 8C, in which the rotation process of oval cam 41 is viewed as being rotated counter-clockwise for 90 degrees, the moving bars 42 being pushed out of the latch holes 26 and inserted into the socket holes 13; when the socket holes 13 on the moving bars 42 are to be detached from the latch holes 26, i.e. when the door 20 of the FOUP is to be opened, the way of operation is as sequentially shown in FIGS. 8C to 8E, in which the rotation process of oval cam 41 is viewed as being rotated clockwise for 90 degrees, the moving bars 42 being pulled out of the socket holes 13 and withdrawn into the latch holes 26. The mechanical principle of what is described above is that, with the oval cam 41 having a longer diameter X and a shorter diameter Y (as shown in FIG. 7A), the moving bars 42 will operate according to the changing radius of the oval cam 41 when the oval cam 41 rotates. Moreover, the rotation of the oval cam 41 can also lead the guiding elements 422 of moving bars 42 and the V-shaped notches 411 of oval cam 41 to interfere with each other so that the oval cam 41 automatically rotates to a fixed position when rotating to a certain angle for the moving bars 42 to be pushed out of or withdrawn into the latch holes 26.

Figure 8A:
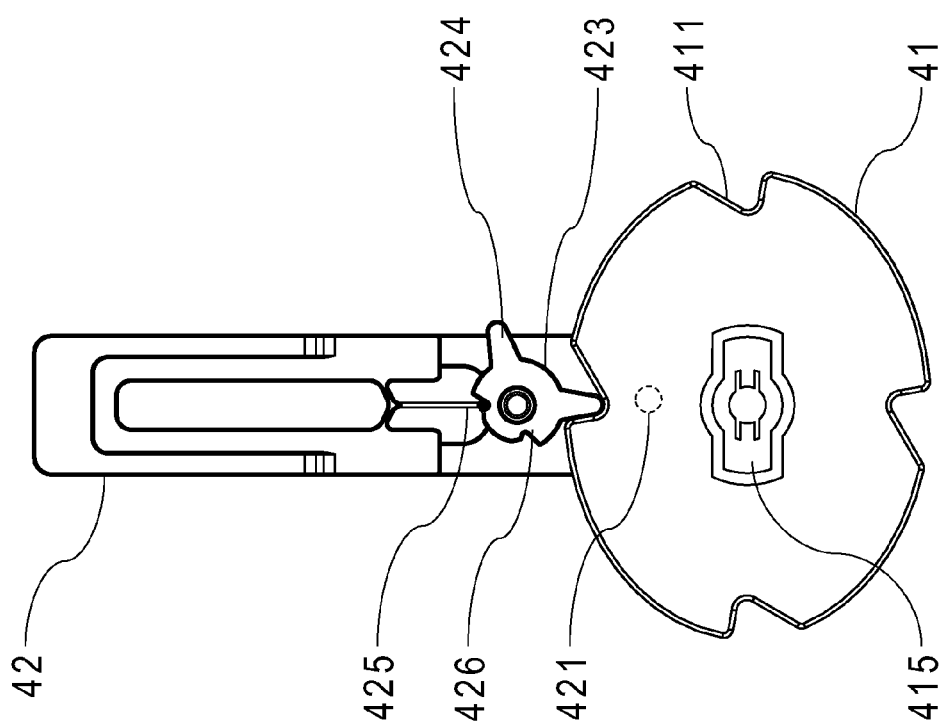
FIG. 8A to FIG. 8E are views of the operation of latch component of the present invention.
Figure 8B:
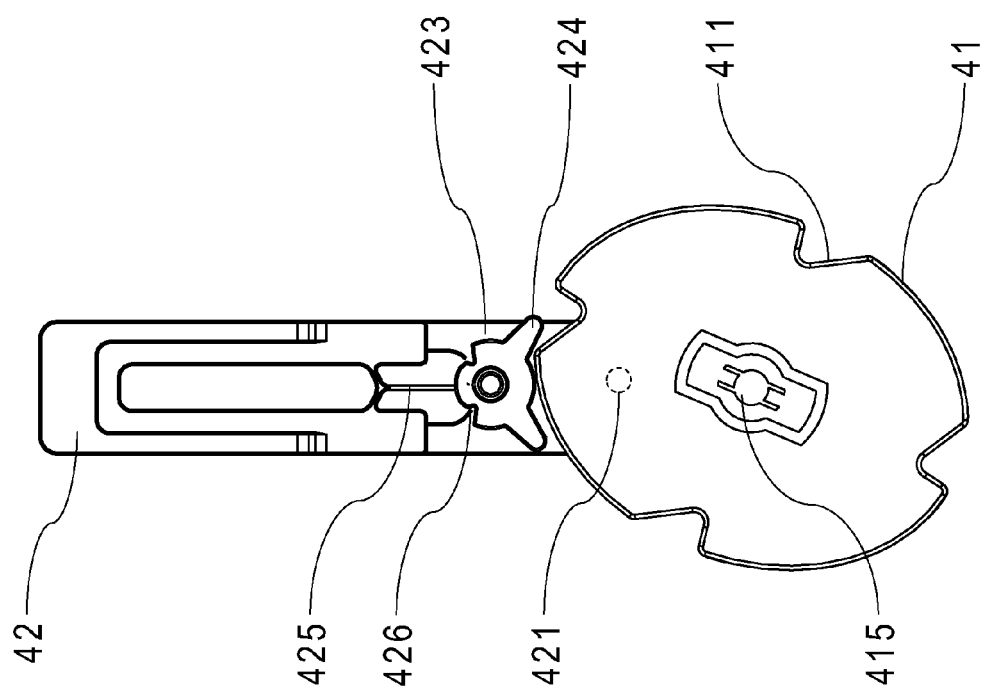
Figure 8C:
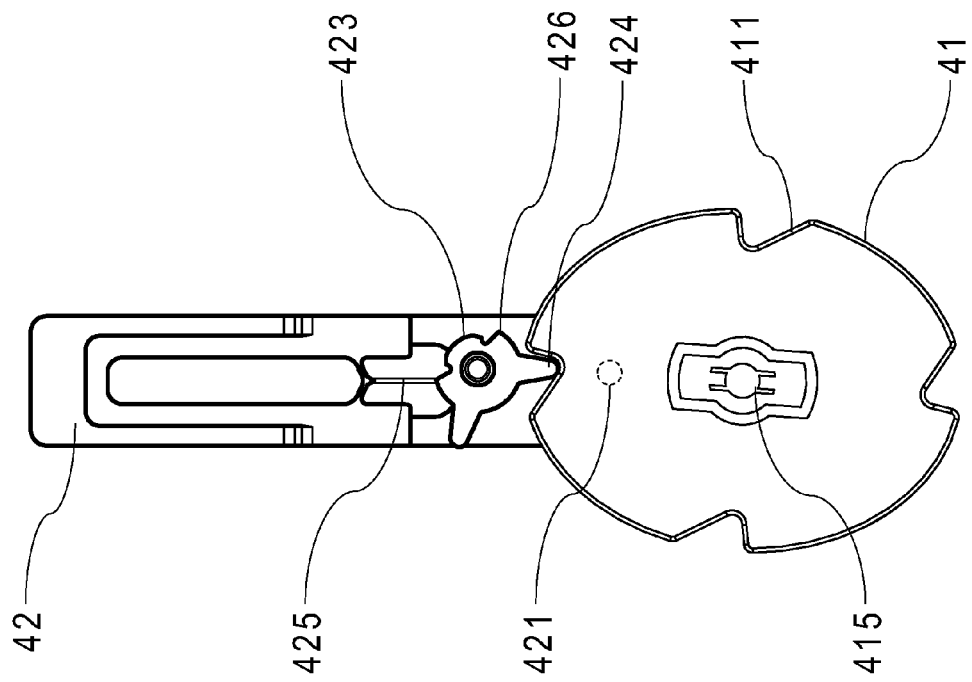
Figure 8D:
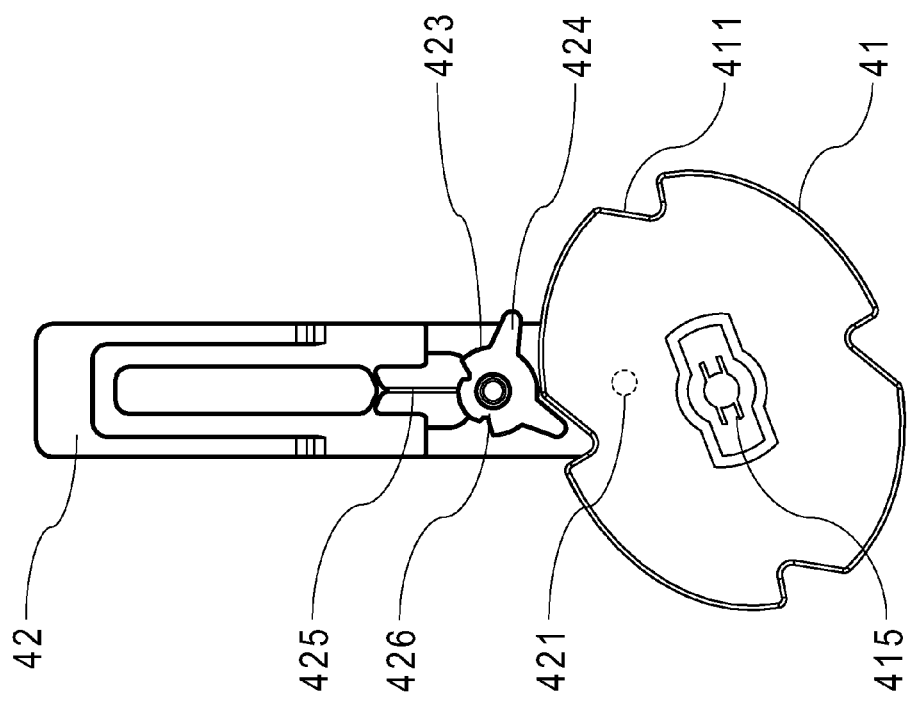
Figure 8E:
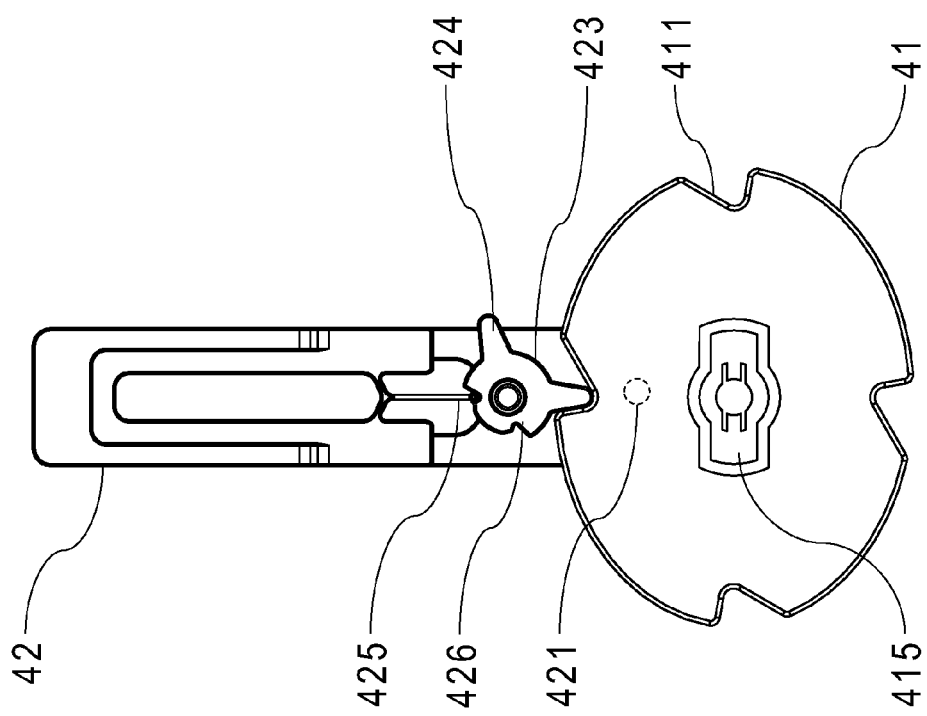

The way how the guiding elements 422 and the V-shaped notches 411 of the present embodiment interfere with each other is further described: when the rotation position of oval cam 41 is as shown in FIG. 8A, i.e. the guiding rods 424 are snapped with the shorter side 41S of the V-shaped notch 411; when the oval cam 41 is driven by the opening latch to rotate counter-clockwise, namely, the different between the rotation position as shown in FIG. 8A and that in FIG. 8C is about 68 degrees, the longer side 41L of the V-shaped notch 411 pushes the guiding rods 424 to drive the guiding wheel 423 to rotate, and the moving bars 42 protrude toward the exterior because the radius of the oval cam 41 becomes longer; when the rotation position of oval cam 41 is as shown in FIG. 8B, an end of the V-shaped notch 411 is located between the pair of guiding rods 424 and is in contact with and resists the guiding rods 424; when the oval cam 41 continues to rotate counter-clockwise, i.e. the degree it rotates is larger than 68 degrees, the guiding rods 424 automatically slide into the V-shaped notch 411 along the longer side 41L of the V-shaped notch 411 and make the guiding element 422 halt for a guiding rod 424 to contact and resist the shorter side 41S of the V-shaped notch 411, meantime the oval cam 41 rotating counter-clockwise for about 90 degrees, as shown in FIG. 8C. Following the operation described above, the moving bars 42 are now pushed out of the latch holes 26 and inserted into the socket holes 13 for the door 20 to lock and close the container body 10. In the present embodiment, when the FOUP of the present invention is horizontally placed, even if the error in angle of the opening latch (not shown in Figure) of the Wafer Load Port is larger than 9.44 degrees, the oval cam 41 can still be operated to compensate and eliminate the arrestment error between the opening latch and the latch holes 23 for the door to be successfully locked or opened. Then, for the door 20 to be detached from the container body 10, the rotation position of oval cam 41 changes from that shown in FIG. 8C to that shown in FIG. 8D with the oval cam 41 rotating 68 degrees clockwise; when the rotation degree is larger than 68 degrees, the guiding rods 424 move away from the V-shaped notches 411 and the operation of opening the door 20 is completed.

In addition to the operation of oval cam 41 as described above, the present invention further discloses another embodiment in which the moving bars 42 are further disposed with a spring element 425. Referring then to FIG. 7B, the two ends of the spring element 425 extend from the two sides of the hollowed-out structure of moving bars 42 to the center and together form a third end and a T-shaped structure is thus formed. Therefore the spring element 425 is integrated with the moving bars 42 and is manufactured by injection molding. Moreover, the third end is then embedded in a fixing notch 426 on the guiding wheel 423. When the oval cam 41 automatically rotates to a fixed position, i.e. the oval cam 41 rotates to a horizontal fixed position as shown in FIG. 8A or to a perpendicular fixed position as shown in FIG. 8C, the third end of T-shaped structure of spring element 425 respectively snaps with and fixes a pair of fixing notches 426 to provide the function of automatic aligning-fixing and halting.

Figure 9A:
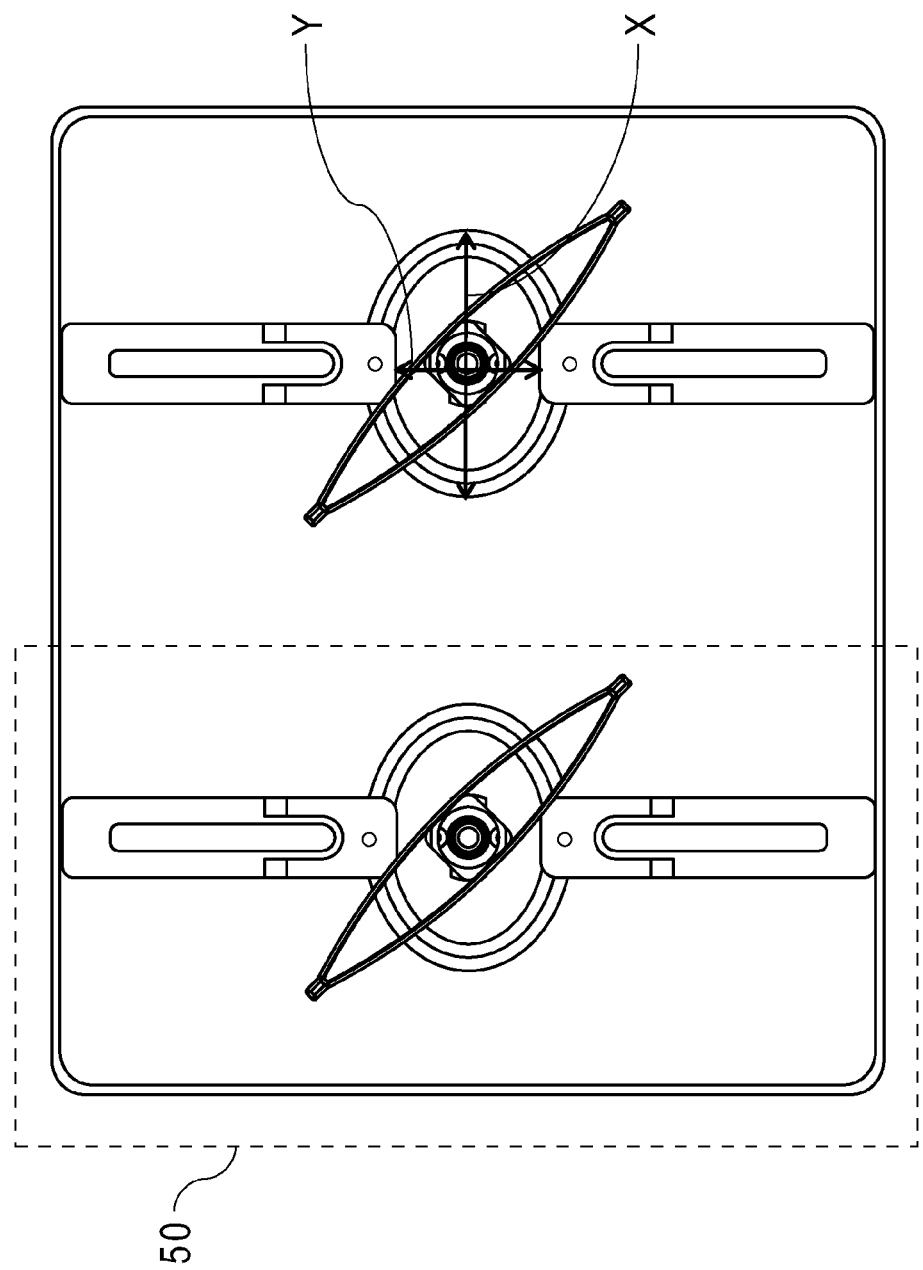
FIG. 9A is a view of the door of a front opening unified pod (FOUP) of the present invention.
Figure 9B:
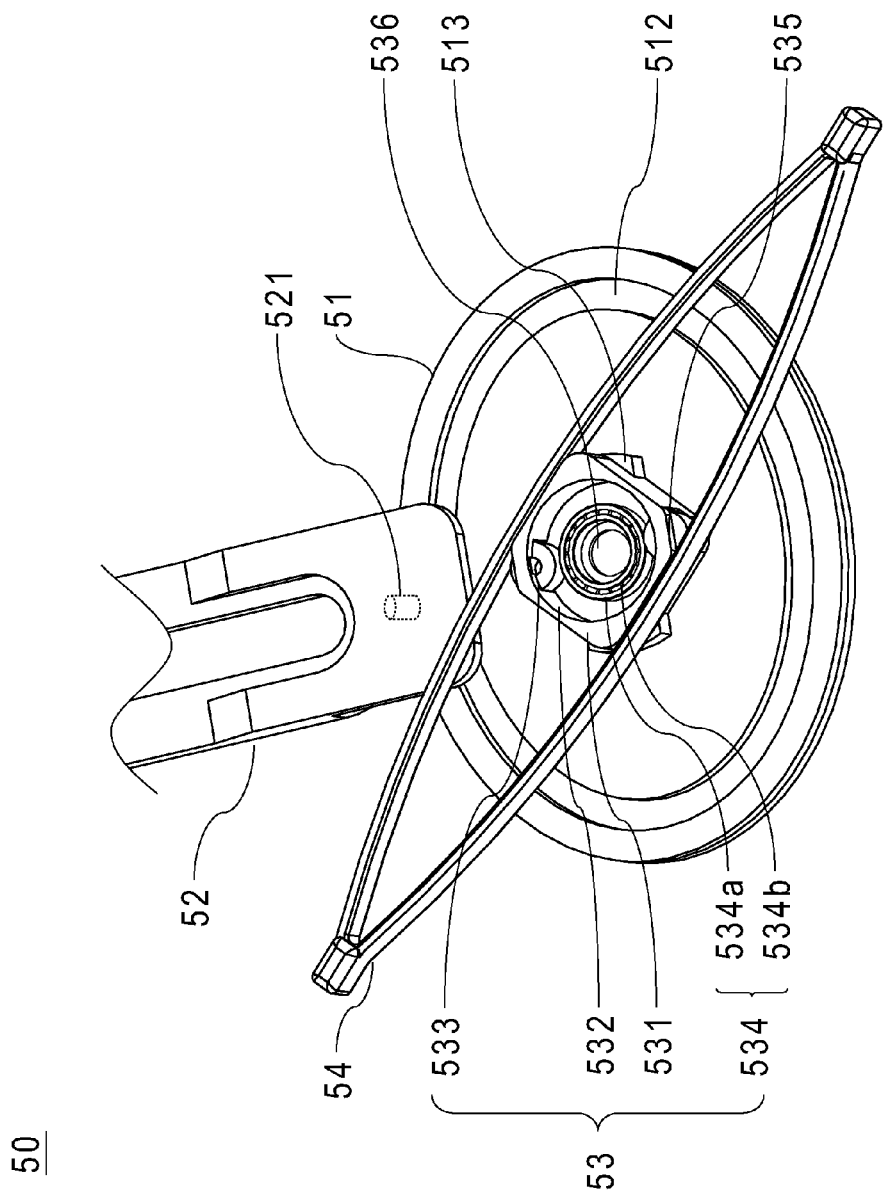
FIG. 9B is a view of the latch component of the present invention.

Then, referring to FIG. 9A, which is a top view of the third embodiment of latch component 50 of the present invention. As shown in FIG. 9B, each latch component 50 is composed of an oval cam 51, a pair of moving bars 52 respectively having an engaging portion 521, a guiding element 53 disposed at the center of oval cam 51, and a long narrow spring 54 framingly disposed on the guiding element 53, wherein the long narrow spring 54 can be made of elastic materials such as polymer plastic material and rubber material, which is not limited in the present invention.

In the present embodiment, at least a groove 512 is disposed on the surface of the oval cam 51 for the engaging portions 521 of the pair of moving bars 52 to be respectively engaged in the groove 512 so that the moving bars 52 can be engaged with the oval cam 51. Moreover, the guiding element 53 of the present embodiment is composed of a rectangular flange 531 with a rounded inner groove 532 formed in its inner side, a pair of rollers 533, and an bearing 534, wherein opposite corners of the inner side of the rectangular flange 531 are respectively disposed with a through hole 535 that penetrates the inner and outer sides of the rectangular flange 531 for a roller 533 to be respectively disposed in each through hole 535. A hollow cylinder 536 is further disposed at the center of the rounded inner groove 532. The oval cam 51, the rectangular flange 531, and the hollow cylinder 536 are integrated as one piece. Moreover, a bearing 534 is circumferentially disposed on the hollow cylinder 536, and the rim of the bearing 534 has a ring 534a with a notch, in which are a plurality of balls 534b. By using the bearing 534 in the present embodiment, not only can the rotation of the oval cam 51 become smoother, but the particles generated due to friction can also be reduced and the pollution in FOUP can also be prevented.

The operation of the present embodiment is then described in detail. First, the oval cam 51 in the present embodiment can be made of metal (such as stainless steel) or polymer plastic material (such as Teflon and PEEK), which is limited in the present invention. Then, referring to FIG. 9B, an arrester 513 is further disposed at the center of the oval cam 51. The arrester 513 is a rectangular structure with its long axis horizontally deployed along with the diameter X of the oval cam 51 (as shown in FIG. 9A). The guiding element 53 is further disposed on the arrester 513, the pair of corners of which without disposing rollers 533 respectively overlap and connect with the two shorter sides of the arrester 513. When the opening latch of the Wafer Load Port is inserted into the latch hole 23 of the door 20, it connects the arrester 513. Since the opening latch and the arrester 513 are in contact with each other in the process in which the oval cam 51 is driven to rotate, therefore, the arrester 513 of the present invention can be made of polymer plastic material, especially highly wear-resistant material such as PEEK, to reduce particles generated during the to-and-fro operation and pollution in the FOUP.

Figure 10A:
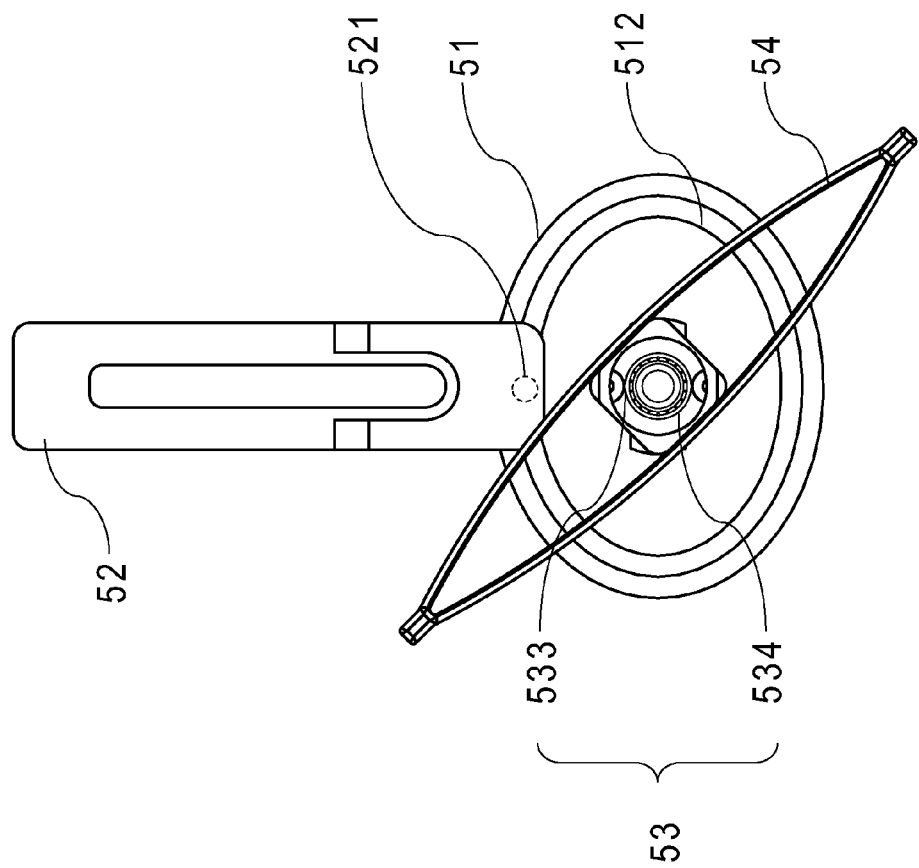
FIG. 10A to FIG. 10C are views of the operation of latch component of the present invention.
Figure 10B:
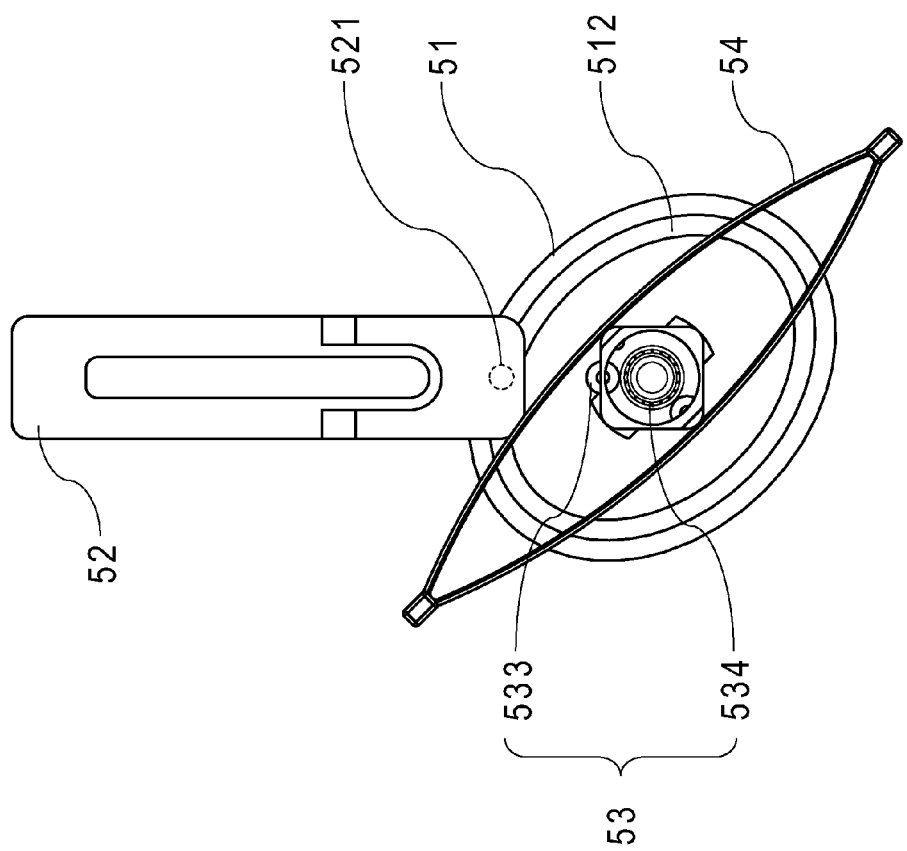
Figure 10C:
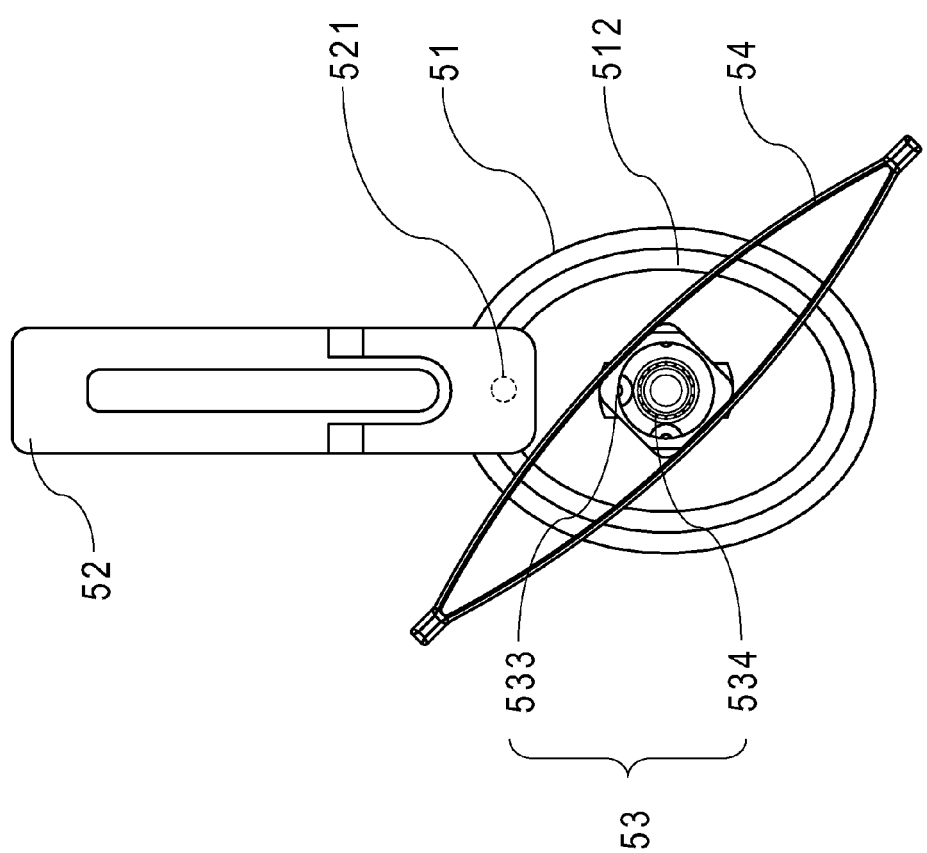

Then, referring to FIGS. 10A to 10C, which are views of the rotation process of oval cam of the third embodiment of the present invention. In the present embodiment, by controlling the rotation of the oval cam 51, the moving bars 52 go to and fro between a pair of socket holes 13 (as shown in FIG. 1) and a pair of latch holes 26 (as shown in FIG. 2). First, when the socket holes 13 on the moving bars 52 and the latch holes 26 are to be joined with each other, i.e. when the door 20 of the FOUP is to be closed, the way of operation is as sequentially shown in FIGS. 10A to 10C, in which the rotation process of oval cam 51 is viewed as being rotated clockwise for 90 degrees, the moving bars 52 being pushed out of the latch holes 26 and inserted into the socket holes 13; when the socket holes 13 on the moving bars 52 are to be detached from the latch holes 26, i.e. when the door 20 of the FOUP is to be opened, the way of operation is as sequentially shown in FIGS. 10C to 10A, in which the rotation process of oval cam 51 is viewed as being rotated counter-clockwise for 90 degrees, the moving bars 52 being pulled out of the socket holes 13 and withdrawn into the latch holes 26. The mechanical principle of what is described above is that, with the oval cam 51 having a longer diameter X and a shorter diameter Y (as shown in FIG. 9A), the moving bars 52 will operate according to the changing radius of the oval cam 51 when the oval cam 51 rotates. Moreover, the rotation of the oval cam 51 can also lead one end of the moving bars 52, the guiding elements 53 of oval cam 51, and the long narrow spring 54 to interfere among one another so that the oval cam 51 automatically rotates to a fixed position when rotating to a certain angle for the moving bars 52 to be pushed out of or withdrawn into the latch holes 26.

The way how one end of the moving bars 52, the guiding elements 53 of oval cam 51, and the long narrow spring 54 as described above interfere among one another is further described: when the rotation position of oval cam 51 is as shown in FIG. 10A, the moving bars 52 and the long narrow spring 54 contact and resist each other, and the inner edge of the long narrow spring 54 is neighboring to and contacts one side of the rectangular flange 531 of the guiding element 53; therefore, the width of the opening of the long narrow spring 54 framingly disposed on the guiding element 53 is equivalent to the width of the rectangular flange 531. When the oval cam 51 rotates clockwise (the difference between the rotation position as shown in FIG. 10A and that in FIG. 10B is about 45 degrees), the way in which the long narrow spring 54 contacts the rectangular flange 531 changes from contacting on neighboring sides to contacting via rollers 533. The rollers 533 also roll along the inner edge of the long narrow spring 54, and meantime the width of the opening of the long narrow spring 54 is equivalent to the length of the diagonal line of the rectangular flange 531. When the oval cam 51 continues to rotate clockwise (meaning the rotation degree is larger than 45 degrees), the size of opening of the long narrow spring 54 decreases as the rectangular flange 531 rotates. Meantime, a restoring force is generated by the long narrow spring 54 so that the rollers 533 are pressed and roll automatically to one side of the rectangular flange 531 till they are neighboring to and in contact with the inner edge of the long narrow spring 54, as shown in FIG. 10C, meantime the width of the opening of the long narrow spring 54 framingly disposed on the guiding element 53 being equivalent to the width of the rectangular flange 531. Following the operation described above, the moving bars 52 are now pushed out of the latch holes 26 and inserted into the socket holes 13 for the door 20 to lock and close the container body 10. In the present embodiment, when the FOUP of the present invention is horizontally placed, even if the error in angle of the opening latch (not shown in Figure) of the Wafer Load Port is larger than 9.44 degrees, the oval cam 51 can still be operated to compensate and eliminate the arrestment error between the opening latch and the latch holes 23 for the door to be successfully locked or opened. Then, for the door 20 to be detached from the container body 10, the rotation position of oval cam 51 changes from that shown in FIG. 10C to that shown in FIG. 10B with the oval cam 41 rotating 45 degrees counter-clockwise; when the rotation degree is larger than 45 degrees, the rotation of the rectangular flange 531 results in change in the width of the opening of the long narrow spring 54 and a restoring force is generated by the long narrow spring 54 to drive the rollers 533 to roll, and thus the operation of opening is completed. Moreover, with the rollers 533 and the long narrow spring 54 corresponding to each other, the particles generated due to friction can be greatly reduced and the pollution in FOUP can be prevented.

Figure 11:
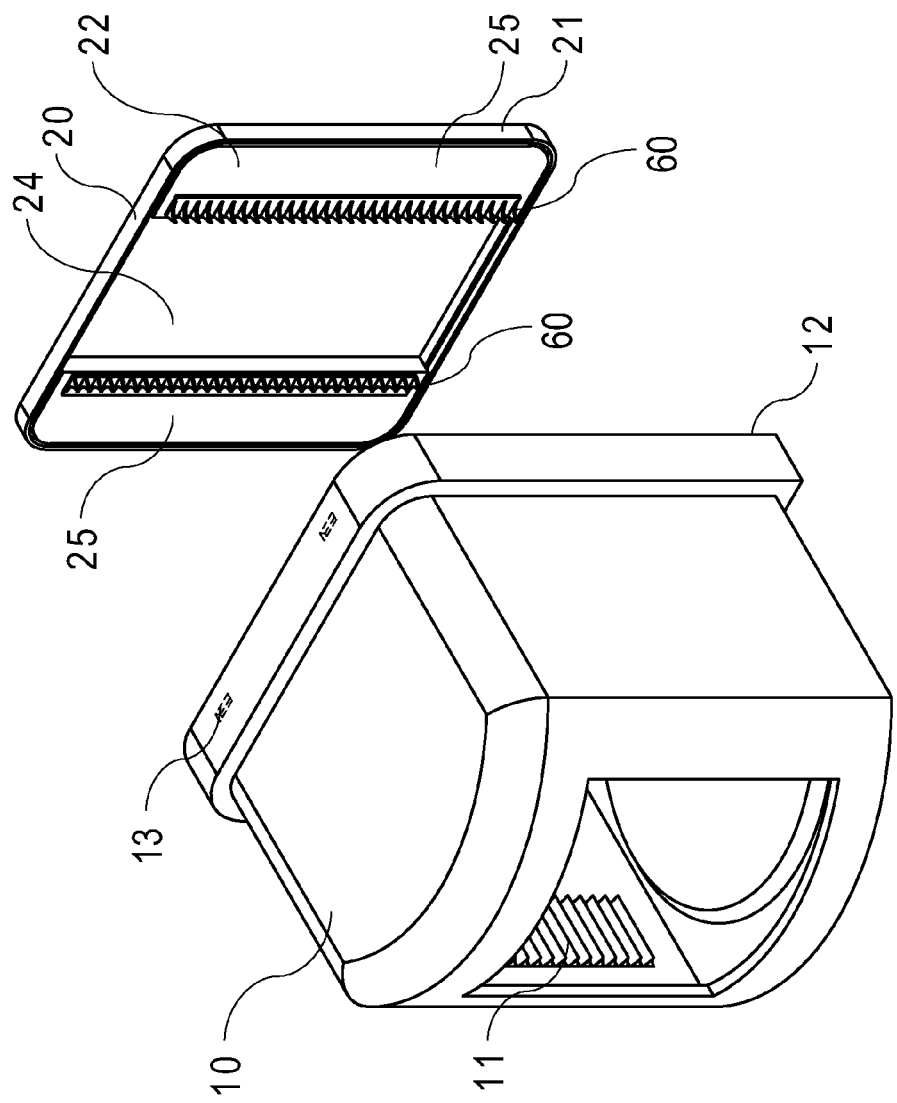
FIG. 11 is a view of a front opening unified pod (FOUP) of the present invention.

Then, referring to FIG. 11, which is a view of wafer container of the present invention. The wafer container is a front opening unified pod (FOUP), which includes a container body 10 and a door 20. A plurality of slots 11 are disposed in the container body 10 for sustaining a plurality of wafers, and an opening 12 is formed on one sidewall of the container body 10 for importing and exporting the plurality of wafers. The door 20 includes an outer surface 21 and an inner surface 22. The outer surface 21 of the door 20 is disposed with at least a latch hole (not shown in Figure) for opening or closing the FOUP, and the center of inner surface 22 of the door 20 is disposed with a recess 24 that is located between two platforms 25, wherein the aforementioned latch component 60 is disposed in the two platforms 25. The primary objective of the recess 24 is to sustain the plurality of wafers in the container body 10 for shortening the length between the front side and the back side of the FOUP. A wafer restraint module 60 is respectively disposed on two platforms 25 for restricting the movement of wafers toward the opening of the wafer container and controlling the number of wafers settling down the recess 24.

The length of the recess 24 of the inner surface 22 of door 20 as described above is related to the distance between slots 11 in container body 10 and the number of the wafers. The distance between 12" wafers has been a standard regulation in the industry to achieve maximum capacity of loading and ensure at the same time that there is enough space for the mechanical arm to stretch in for importing or exporting wafers. In general, the number of wafers to be in the wafer container is 25 pieces. However, the width and the depth of recess 24 of the present invention can be adjusted. When the thickness of the door 20 is constant, the depth of recess 24 can be adjusted to be deeper for the whole wafer to be placed further into recess 24, and the width of recess 24 can also be adjusted to be wider accordingly.

Furthermore, the inner surface 22 of door 20 of the present invention can be a plane surface or can be without recess; at least a latch component (such as the aforementioned component 30, 40, 50) can be disposed between the inner surface 22 and the outer surface 21, and a latch component is disposed in one preferred embodiment. The latch component 30, 40, or 50 is the same as what is described in the aforementioned embodiment and will not be described in detail. In addition, in order for the plurality of wafers already placed in the container body 10 to be fixed when the door 20 closes the container body 10, at least a restraint module 60 can be disposed on the inner surface 22 of the above-mentioned plane surface or at least a restraint module can be disposed near the central area of the above-mentioned plane surface, as shown in FIG. 11.

Obviously, the latch component of the present invention can only make to-and-fro movement when being driven by the oval cam, moving forward and backward, and no shift will occur on the longitudinal (vertical) direction. Therefore, the latch component of the present invention is a simpler design. When the door and the container body of the present invention close, a pair of moving bars are driven by the oval cam to move toward the edge of the door, and the front plane of moving bars then go through latch holes on the door and are fastened in socket holes corresponding to latch holes near the edge of the opening of container body. Then, an aeration device can be disposed for aerating air-tight component (not shown in Figure) between the door and the container body to isolate interior from exterior of container body.

While the invention has been described by way of examples and in terms of the preferred embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A wafer container including a container body having a plurality of slots therein for receiving a plurality of wafers and having an opening formed on one sidewall of which for importing or exporting said plurality of wafers, at least a pair of socket holes being disposed at an edge of said opening of said container body; and a door having an outer surface and an inner surface with at least a pair of latch holes corresponding to said pair of socket holes being disposed at the edge of said door, said door joining with said opening of said container body via said inner surface for protecting said plurality of wafers in said container body, the characteristic of said wafer container in that:

a recess is disposed on said inner surface of said door and located between two platforms, and each said platform is disposed with a latch component, said latch component comprising an oval cam with an arrester disposed at its center, at least a pair of V-shaped notches disposed on one surface of said oval cam, said surface of said oval cam being disposed with at least a groove, an oval platform disposed on said surface of said oval cam, in which said pair of V-shaped notches of said oval cam are disposed on two ends of longer diameter of said oval platform, a pair of moving bars respectively having an engaging portion that are engaged in said groove for said moving bars to be engaged with said oval cam, and a guiding element disposed on said moving bars, wherein said arrester is used to control the rotation of said oval cam for said moving bars to go to and fro between said pair of socket holes and said pair of latch holes.

2. The wafer container according to claim 1, wherein at least a pair of fixing notches are further oppositely disposed on two ends of diameter of said oval cam.

3. The wafer container according to claim 2, wherein a fixing structure is further disposed on said moving bars and said fixing structure comprises a hollowed-out spring element and a fixing portion.

4. The wafer container according to claim 1, further comprising a pair of fixing spring which are integrated with said moving bars.

5. The wafer container according to claim 1, wherein material of said oval cam and of said arrester is selected from the group consisting of: metal material or polymer plastic material.

6. The wafer container according to claim 1, wherein at least a restraint module is further respectively disposed on said two platforms.

* * * * *